US010763003B2

(12) United States Patent
Nömayr et al.

(10) Patent No.: US 10,763,003 B2
(45) Date of Patent: Sep. 1, 2020

(54) METHOD FOR MANUFACTURING A CHARGE DISSIPATIVE SURFACE LAYER

(71) Applicants: AIRBUS DS GMBH, Taufkirchen (DE); INTEGRITY TESTING LABORATORY INC., Markham, Ontario (CA)

(72) Inventors: Christel Nömayr, Munich (DE); Claus Zimmermann, Munich (DE); Zelina Iskanderova, Toronto (CA); Jacob Kleiman, Thornhill (CA)

(73) Assignees: Airbus DS GmbH, Taufkirchen (DE); Integrity Testing Laboratory Inc., Ontario (CA)

( * ) Notice: Subject to any disclaimer, the term of this patent is extended or adjusted under 35 U.S.C. 154(b) by 689 days.

(21) Appl. No.: 15/160,684

(22) Filed: May 20, 2016

(65) Prior Publication Data
US 2016/0343464 A1    Nov. 24, 2016

Related U.S. Application Data

(63) Continuation of application No. PCT/EP2014/003104, filed on Nov. 20, 2014.

(30) Foreign Application Priority Data

Nov. 21, 2013    (EP) .................................... 13005467

(51) Int. Cl.
*C23C 14/48* (2006.01)
*H01B 1/04* (2006.01)
(Continued)

(52) U.S. Cl.
CPC ............... *H01B 1/04* (2013.01); *C08J 7/123* (2013.01); *C23C 14/0605* (2013.01);
(Continued)

(58) Field of Classification Search
CPC . H01B 1/04; H01B 1/128; H01B 1/127; C08J 7/123; C08J 2379/08; C23C 14/48; C23C 14/0605
See application file for complete search history.

(56) References Cited

U.S. PATENT DOCUMENTS 4,199,650 A    4/1980    Mirtich et al.
5,391,994 A    2/1995    Baillie et al.
(Continued)

FOREIGN PATENT DOCUMENTS

CN    102362006 A    2/2012
CN    102390607 A    3/2012
(Continued)

OTHER PUBLICATIONS

Japanese Office Action for Application No. 2016-554803 dated Aug. 13, 2018.
(Continued)

*Primary Examiner* — Hai Y Zhang
(74) *Attorney, Agent, or Firm* — Jenkins, Wilson, Taylor & Hunt, P.A.

(57) ABSTRACT

A method of manufacturing a charge dissipative surface layer on a member made from or consisting of a dielectric polymeric material or polymer-based composite which is intended to be used in space and other extreme environments, the member having at least one surface, in particular two opposing surfaces, each of the surfaces having a flat or a three-dimensional shape. The method includes carbonizing the at least one surface of the member in a vacuum environment through ion bombardment with simultaneous surface renewal in a dynamic way, by bombardment of the at least one surface with an ion beam formed in a gaseous linear high-current technological ion beam source of rare gas and added predetermined amount of a carbonaceous gas in the same ion beam gas admixture in order to achieve a
(Continued)

treated carbonized surface layer with a uniform surface resistivity in a charge-dissipative range.

5 Claims, 22 Drawing Sheets

(51) Int. Cl.
  C23C 14/06 (2006.01)
  C08J 7/12 (2006.01)
  H01B 1/12 (2006.01)
(52) U.S. Cl.
  CPC ............ *C23C 14/48* (2013.01); *H01B 1/127* (2013.01); *H01B 1/128* (2013.01); *C08J 2379/08* (2013.01)

(56) References Cited

U.S. PATENT DOCUMENTS

| | | | | |
|---|---|---|---|---|
| 6,139,943 | A * | 10/2000 | Long | B32B 27/00 252/511 |
| 6,392,244 | B1 * | 5/2002 | Grannen et al. | H05H 1/24 250/492.21 |
| 2010/0009194 | A1 * | 1/2010 | Iskanderova et al. | B32B 29/06 428/409 |
| 2011/0143087 | A1 * | 6/2011 | Alberding | B82Y 30/00 428/114 |
| 2012/0021201 | A1 | 1/2012 | Jun et al. | |
| 2012/0219744 | A1 * | 8/2012 | Walker et al. | B23B 1/08 428/36.91 |
| 2013/0295413 | A1 * | 11/2013 | Iskanderova et al. | B29C 71/04 428/688 |

FOREIGN PATENT DOCUMENTS

| | | |
|---|---|---|
| CN | 105940456 B | 1/2018 |
| JP | 2005-342834 | 12/2005 |
| JP | 2013-511429 | 4/2013 |
| JP | 6393770 B2 | 9/2018 |
| RU | 2141006 C1 | 11/1999 |
| RU | 2189401 C2 | 9/2002 |
| RU | 2244983 C1 | 1/2005 |
| RU | 2297471 C1 | 4/2007 |
| WO | WO 2011/063424 | 5/2011 |

OTHER PUBLICATIONS

European Search Report for EP 13 005467 dated Apr. 3, 2014.
Chinese Office Action for Application No. 201480073783 dated Jan. 26, 2017.
Russian Exam Office Action and Search Report for Application No. 2016122573 dated Dec. 27, 2017.
ASTM E903-12 Standard Test Method for Solar Absorptance, Reflectance, and Transmittance of Materials Using Integrating Spheres.
ASTM E408-13 Standard Test Methods for Total Normal Emittance of Surfaces Using Inspection-Meter Techniques.
Dong, H., et al., "State-of-the-art overview: ion beam surface modification of polymers towards improving tribological properties," Surface and Coatings Technology, vol. 111, Issue 1, Jan. 10, 1999, pp. 29-40.
DuPont Technical Information, PyraluxR LF Coverlay Flexible Composites, 2012.
Fink, D., "Fundamentals of ion-irradiated polymers," Elsevier, 2004.
International Standard ISO 15856:2010(E): Space systems—space environment—simulation guidelines for radiation exposure of non-metallic materials, 2010.
Iskanderova, Z., et al., "CARBOSURFTM Surface Modification Technology for Charge Dissipative and Radio-Transparent GEO Durable Space Polymers", Proceedings of the 9th International Conference "Protection of Materials and Structures from Space Environment (ICPMSE-9)," Ed. J. Kleiman, AIP Conference Proceedings, 2009, p. 588-599.
Kleiman, J., et al., "Ion-beam Treatment for Enhancement of Surface Conductivity and Durability of Space Polymers: Results, Analysis, Mechanisms," Protection of Materials and Structures from the Space Environments, Eds. J. Kleiman, M. Tagawa, and Y. Kimoto, Springer, 2013, pp. 317-326.
Kondyurin, A.V., et al., "Interactions of ion beam with polymer: physical picture," Ion Beam Treatment of Polymers: Application Aspects from Medicine to Space, Elsevier, 2010, pp. 1-10.
Mott, N.F., "Conduction in Non-crystalline Materials. III. Localized states in a pseudogap and near extremities of conduction and valence bands," Philosophical Magazine, 19:160, 835-852, 1969.
Selke, L.A., "What Is Pumice Composed of?" Livestrong.com, Oct. 6, 2015, http://www.livestrong.com/article/174049-what-is-pumice-composed-of/.
Shante, V.K.S., "Variable-Range Hopping Conduction in Thin Films," Physics Letters, vol. 43A, Issue 3, Mar. 12, 1973, pp. 249-250.
Shounak De, S., et al., "Mott conductivity in nanocluster carbon thin films," Optoelectronics and Advanced Materials—Rapid Communications, vol. 3, No. 12, Dec. 2009, pp. 1365-1367.
Tyutnev, A.P., et al., "Radiation-Induced Conductivity in Polymers during Long-term Irradiation," High Energy Chemistry, 2006, vol. 40, No. 5, pp. 319-330.
Xu, et al., "Comparative Studies on Influence of Acetylene to Argon Flow Rate Ratios on Nano-Scratch Behavior of a-C:H Films Produced on Steel Substrates by Plasma Immersion Ion Implantation and Deposition," Thin Solid Films, Elsevier-Sequoia S.A. Lausanne, CH, vol. 516, No. 2-4, pp. 252-256, Nov. 17, 2007.
Zaporojtchenko, V., et al., "Etching Rate and Structural Modification of Polymer Films During Low Energy Ion Irradiation," Nuclear Instruments and Methods in Physics Research B (NIMB), 208, 155 (2003).
International Search Report with IPRP and Written Opinion for Application No. PCT/EP2014/003104 dated Apr. 14, 2015.
Bernard et al., "Polymer-Derived Boron Nitride: A Review on the Chemistry, Shaping and Ceramic Conversion of Borazine Derivatives," Materials 2014, vol. 7, pp. 7436-7459, 2014.
European Office Action for Application No. 13005467.9 dated Sep. 7, 2016.
European Office Action for Application No. 13005467.9 dated Feb. 8, 2017.
Chinese Office Action for Application No. 201480073783.4 dated May 4, 2017.
Chinese Office Action for Application No. 201480073783.4 dated Aug. 7, 2017.
Japanese Office Action for Application No. 2016-554803 dated Jan. 4, 2018.
Japanese Office Action for Application No. 2016-554803 dated Jun. 7, 2017.

\* cited by examiner

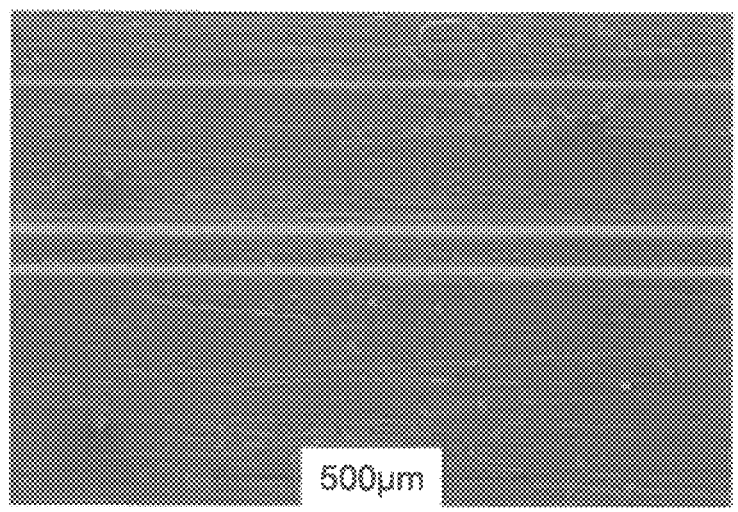
Fig. 6a — After Treatment, Back side
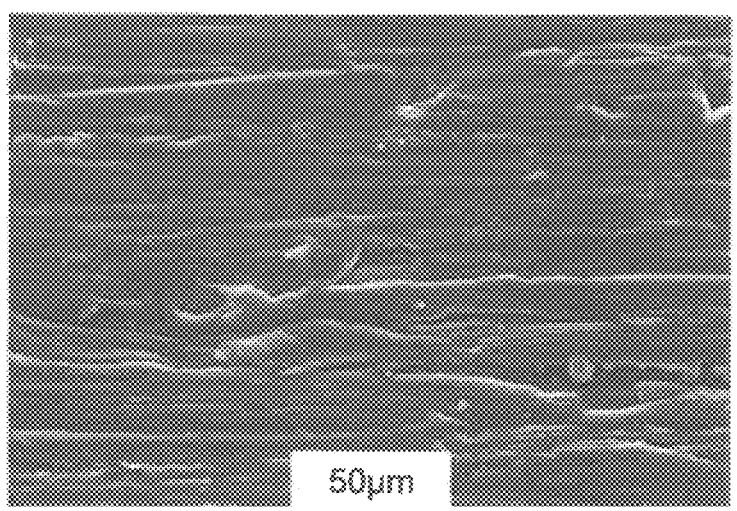
Fig. 6b — After Treatment, Back side

| Peaks (P)\Peaks | Si2p | P2p | C1s | Ca2p | N1s | O1s |
|---|---|---|---|---|---|---|
| Kapton 100HN | 0.11 | 2.14 | 69.80 | 0.17 | 6.14 | 21.64 |

Fig. 9a

| Selected FCC front/ion beam treatment | C1s At% | N1s At% | Na1s At% | O1s At% | Si2p At% |
|---|---|---|---|---|---|
| FCC front1/(Ar+C2H2) | 92.20 | 0.56 | 0.06 | 7.09 | 0.09 |
| FCC front2/(Ar+C2H2) | 91.29 | 0.65 | 0.45 | 7.55 | 0.05 |

Fig. 9b

| Name | Peak BE | FWHM eV | Area (P) CPS.eV | At.% | SF |
|---|---|---|---|---|---|
| C1s | 284.68 | 1.38 | 36598.04 | 85.30 | 1.000 |
| C1s A | 286.37 | 1.72 | 4253.48 | 9.92 | 1.000 |
| C1s B | 287.84 | 1.24 | 881.98 | 2.06 | 1.000 |
| C1s C | 289.25 | 1.73 | 1162.07 | 2.71 | 1.000 |

Fig. 9c

| FCC ID | SR soft electrodes [MΩ/sq] | SR soft pad [MΩ/sq] |
|---|---|---|
| No1-front | 14 | 10 |
| No1-rear | 14 | 12 |
| No2-front | 10 | 7 |
| No2-rear | 15 | 11 |
| No3-front | 7 | 6 |
| No3-rear | 7 | 8 |
| No4-front | 8 | 6 |
| No4-rear | 8 | 8 |

A:

| | A |
|---|---|
| | B |

| FCC ID | Side | Surf. Res. [MΩ/sq] | Side | Surf. Res. [MΩ/sq] |
|---|---|---|---|---|
| 1 short | f | 20 | r | 25 |
| 2 long | f | 9 | r | 13 |
| 3 short | f | 12 | r | 16 |
| 4 short | f | 13 | r | 23 |
| 5 long | f | 9 | r | 12 |
| 6 short | f | 9 | r | 23 |
| 7 short | f | 11 | r | 24 |
| 8 short | f | 11 | r | 29 |
| 9 short | f | 13 | r | 35 |
| 10 short | f | 12 | r | 32 |
| 11 short | f | 11 | r | 26 |
| 12 short | f | 10 | r | 17 |
| 13 short | f | 10 | r | 29 |
| 14 short | f | 8 | r | 22 |
| 15 short | f | 8 | r | 19 |
| 16 short | f | 10 | r | 17 |
| 17 short | f | 11 | r | 16 |
| 18 long | f | 7 | r | 23 |
| 19 short | f | 9 | r | 30 |
| 20 long | f | 6 | r | 10 |
| 21 long | f | 10 | r | 16 |
| 22 long | f | 7 | r | 13 |
| 23 long | f | 6 | r | 11 |
| 24 long | f | 6 | r | 13 |
| 25 short | f | 6 | r | 14 |
| 26 short | f | 8 | r | 21 |
| 27 short | f | 7 | r | 18 |
| 28 short | f | 6 | r | 18 |

| | A |
|---|---|
| | B |

| FCC ID | Side | Surf. Res. [MΩ/sq] | Side | Surf. Res. [MΩ/sq] |
|---|---|---|---|---|
| 29 short | f | 7 | r | 18 |
| 30 short | f | 10 | r | 14 |
| 31 short | f | 7 | r | 12 |
| 32 long | f | 7 | r | 8 |
| 33 long | f | 6 | r | 9 |
| 34 long | f | 5 | r | 8 |
| 35 long | f | 5 | r | 9 |
| 36 long | f | 9 | r | 13 |
| 37 short | f | 7 | r | 15 |
| 38 short | f | 6 | r | 13 |
| 39 short | f | 7 | r | 16 |
| 40 short | f | 7 | r | 21 |
| 41 short | f | 8 | r | 24 |
| 42 short | f | 5 | r | 19 |
| 43 long | f | 6 | r | 14 |
| 44 long | f | 8 | r | 16 |
| 45 long | f | 8 | r | 20 |
| 46 long | f | 11 | r | 21 |
| 47 short | f | 8 | r | 16 |
| 48 short | f | 14 | r | 15 |
| 49 short | f | 10 | r | 24 |
| 50 short | f | 7 | r | 18 |
| | average front | 9 | average rear | 18 |
| | max | 20 | max | 35 |
| | min | 5 | min | 5 |
| | STD | 2.8 | STD | 6.4 |

Fig. 10bB

| FCC ID | pre humidity test [MΩ/sq] | post humidity test [MΩ/sq] |
|---|---|---|
| 11 f | 20 | 21 |
| 11 r | 58 | 66 |
| 7 f | 16 | 19 |
| 7 r | 76 | 58 |
| 16 f | 18 | 21 |
| 16 r | 35 | 44 |

| FCC ID | pre TC [MΩ/sq] | post TC [MΩ/sq] |
|---|---|---|
| 32-fa | 10 | 10 |
| 32-fb | 5 | 5 |
| 32-fc | 14 | 14 |
| 32-ra | 17 | 22 |
| 32-rb | 7 | 11 |
| 32-rc | 12 | 15 |
| 34-fa | 8 | 8 |
| 34-fb | 4 | 4 |
| 34-fc | 7 | 8 |
| 34-ra | 13 | 15 |
| 34-rb | 7 | 9 |
| 34-rc | 14 | 17 |
| 35-fa | 8 | 9 |
| 35-fb | 3 | 4 |
| 35-fc | 8 | 9 |
| 35-ra | 15 | 17 |
| 35-rb | 9 | 11 |
| 35-rc | 23 | 25 |
| 37-fa | 20 | 21 |
| 37-fb | 6 | 7 |
| 37-fc | 11 | 14 |
| 37-ra | 25 | 31 |
| 37-rb | 12 | 16 |
| 37-rc | 23 | 27 |
| 23-fa | 10 | 14 |
| 23-fb | 5 | 6 |

Fig. 11aA

| Sample ID | Surface Resistivity (MΩ/sq) | | | |
|---|---|---|---|---|
| | Ion-Beam Treated | 4 years space equivalent of GEO simulated exposure | 15 years space equivalent of GEO simulated exposure | Final (following 2 month of storage) |
| Short FCC 51 (back side) | 63.3 | 16.3 | 7.1 | 7.2 (included in ESD testing) |
| Short FCC 52 (front side) | 11.2 | 5.4 | 2.8 | 3.1 (included in ESD testing) |
| Long FCC piece (back side) | 30.1 | 4.2 | 4.1 | 5.2 |

| # | 1B | 1M | 2B | 2M |
|---|---|---|---|---|
| side | Glossy (front) | Matt (back) | Glossy (Front) | Matt (back) |
| $\alpha_s$ | 0.655 | 0.712 | 0.565 | 0.592 |
| $\varepsilon$ | 0.82 | 0.83 | 0.83 | 0.83 |

Fig. 17a

| Sample ID | Side | Solar Absorptance α | Thermal Emittance ε | α/ε |
|---|---|---|---|---|
| Pristine | Front (#2) | 0.565 | 0.81 | 0.70 |
| | Back (#2) | 0.592 | 0.80-0.81 | 0.74 |
| Ion-Beam Treated | Front (#1) | 0.691 – 0.695 | 0.79-0.80 | ≤0.88 |
| | Back (#1) | 0.712- 0.714 | 0.80 | ≤0.89 |
| GEO-Tested | Front (#5), pristine | 0.787 | 0.78-0.82 | 1.01 |
| | Back (#6), pristine | 0.821 | 0.79-0.81 | ≤1.04 |
| | Back (#1), ion beam treated | 0.817 | 0.79-0.81 | ≤1.04 |

Fig. 17b

| Sample ID | Side | Solar Absorptance (α) | | | Thermal Emittance (ε) | | | α/ε | |
|---|---|---|---|---|---|---|---|---|---|
| | | Before | After | Δα | Before | After | Δε | Before | After |
| Short FCC 51 (ion beam treated) | Back | 0.694 | 0.817 | 0.123 | 0.81 | 0.79 | 0.02 | 0.86 | 1.03 |
| Short FCC 52 (ion beam treated) | Front | 0.695 | 0.787 | 0.092 | 0.81 | 0.78 | 0.03 | 0.86 | 1.01 |
| Long FCC piece (ion beam treated) | Back | 0.714 | 0.820 | 0.106 | 0.81 | 0.8 | 0.01 | 0.88 | 1.02 |

Fig. 17c

| FCC ID | exposed side | SR [MΩ/sq] |
|---|---|---|
| 1 | front | 20 |
| 9 | rear | 35 |
| 51 | rear | 7 (BOL 63) |
| 52 | front | 3 (BOL 11) |

Fig. 17d

METHOD FOR MANUFACTURING A CHARGE DISSIPATIVE SURFACE LAYER

CROSS-REFERENCE TO RELATED APPLICATIONS

This application is a continuation of and claims priority to PCT/EP2014/003104 filed Nov. 20, 2014 which claims the benefit of and priority to European Patent Application No. 13 005 467.9 filed Nov. 21, 2013, the entire disclosures of which are incorporated by reference herein.

TECHNICAL FIELD

The disclosure herein relates to a method for manufacturing a charge dissipative surface layer on a member made from or consisting of a dielectric polymer-based material which is intended to be used in space and such a member.

BACKGROUND

In particular, the present disclosure relates to the field of surface treatment of dielectric polymeric materials with shaped and/or grooved polymeric surfaces, the treatment of surfaces with embedded inorganic particles, or the treatment of dielectric polymer composites with inorganic particulate or fiber fillers. Charge dissipative surface properties are needed for polymer-born devices, such as external spacecraft or solar arrays components, for instance, Flat Cable Conductors (FCCs) with long-term durability of this charge dissipation and other functional properties in GEO space, or polymeric composites-based materials and devices with long-term durability of this charge dissipation in GEO space and in other extreme environments.

Ion bombardment of polymers is widely used in the electronic and other device manufacturing industry, mostly for photo-resists stripping in microelectronics, ion implantation of polymers for optical waveguides formation, plasma surface treatment to enhance adhesion of metals deposited on polymers and printability improvements, polymers' micro-hardness increase, etc. In many cases the medium- or high-dose ion bombardment of a dielectric polymer is causing surface cross-linking or chain destruction due to energy transfer at atomic collisions, as well as surface carbonization. Change of many surface properties have been found to be associated with the compositional, structural, and, quite often, morphological surface transformations due to ion bombardment and selective sputtering of the polymers surfaces in vacuum. Some surface reduction due to ion beams sputtering, gaseous atoms migration with the formation of volatile final products and their release from the surface of the polymers in vacuum, i.e. surface depletion of final gaseous products, and, finally, surface carbon content increase (in the bombarded region), as well as simultaneous and subsequent surface structural reconstruction is called "surface carbonization". Significant change of mechanical and optical or electrical properties, such as surface hardness, wear resistance, oxidation resistance, and electrical surface conductivity, provided in a wide range of values and wide temperature range, may be achieved by ion beam treatments of polymers [See References 1-5].

It is important to mention, that all the studies of surface conductivity, or surface charge dissipation of dielectric polymers, provided by ion beam treatments, have been done on flat, or, to say, planar polymer films, synthesized specifically for the treatment experiments or produced industrially.

Not just advanced space polymer films in various space applications, but also polymer-based products, for instance, such as Flat Cable Conductors (FCCs) that are used as connections between panels on solar arrays in geosynchronous (GEO) orbits, would strongly benefit from providing charge dissipation to its both external surfaces, to prevent the charge collection, arcing and associated damage under radiation environment, especially when to be used in nowadays long-term space missions. However, manufacturing the products for such applications with charge dissipating surface properties might present difficulties.

The FCCs are manufactured in different sizes and shapes, based, for instance, on DuPont Pyralux LF1010, that basically consists of a Pyralux LF1010 copper clad laminate and same type coverlay, i.e. Kapton100HN (1 mil) films, joined together by a special temperature sensitive acrylic adhesive with thin copper strips pressed in between them at processing stages, and the Cu foil strips ending in electrical contacts outside the made structures [6]. Therefore, in FCCs 100 (FIGS. 1 and 2) the dielectric polymeric front and back films do not represent a flat, plain surface, but rather have repeatedly shaped, or, to say, "grooved" surfaces 102, 202, as can be seen in FIG. 1 for the front surface 101 and FIG. 2 for the back surface 201. Since the ion beam treatment is of a line-of-site nature, with quite strong angular dependence of sputtering rate, this surface relief may influence the uniformity and effectiveness of any ion beam treatment, causing shadowing of the ion beam by the walls of formed grooves.

Another critical difference in treatment of real FCC structures is the condition of the back surface. In comparison with a shiny and smooth front FCC surface, the back surfaces were found to be rough and, with small inorganic particles embedded randomly throughout the surface which comes as a result of the specific technological process of manufacturing of the FCCs. The surfaces of FCC units have been characterized extensively by SEM/EDS (Scanning Electron Microscopy/Energy-Dispersive x-ray Spectroscopy) methods. Front (FIG. 3a and FIG. 3b) and back (FIG. 4a) surfaces SEM images 300, 400 with various levels of magnification, combined with elemental composition studies by EDS, have been used for comparative study of the front and back surface morphology and composition of FCCs from a few manufacturing FCC sets. The part of the front side of the FCCs on top of the Cu strips had a shiny flat surface (see FIG. 1). The plain parts of front FCCs surfaces fully resembled Kapton HN surface, as analyzed by both SEM and EDS. Small inclusion particles that could only be detected under high magnification, are calcium phosphate ($Ca_3(PO_4)_2$) particles. They are an essential additive in the Kapton HN manufacturing process in order to reduce handling problems due to electrostatic interaction.

Highly developed surface morphology became clearly evident upon the inspection of the back surface, as shown in FIG. 4a that represent the "back side" surface under high magnification. The back surface looks strongly damaged, and it can be clearly seen in FIG. 4a that significant numbers of tiny, mostly submicron size particles are present in the polymer surface. The elemental composition of these particles can be evaluated by EDS. The detailed elemental composition of these particles corresponds in general to the composition of pumice particles, dust of which is used in the manufacturing process as a water slurry under high pressure to enhance the copper adhesion to special acrylic adhesive used in FCCs production. (Pumice stone is made of the following oxides, according to Indian Granites [8]: 70 to 77 percent silica, 11 to 14 percent alumina, 3 to 5 percent potassium oxide, 3 to 5 percent soda, 1 to 3 percent ferrous oxide, 1 to 2 percent ferric oxide, 0.5 to 1 percent magnesia, less than 0.38 percent titanium oxides, and almost all these elements have been found on the back surface by EDS).

SUMMARY

It is an object of the present disclosure to provide a method for manufacturing charge dissipative surface layers on a member made from or consisting of a dielectric polymer-based material such that the member fulfills requirements for use in GEO space. It is a further object of the present disclosure to provide a corresponding member.

According to a first aspect of the present disclosure, a method for manufacturing a charge dissipative surface layer on a member made from or consisting of a dielectric polymer-based material or composite which is intended to be used in space or other extreme environments is provided. The member may be any product, such as a FCC or a solar array component or a film like member. The member has at least one surface, in particular two opposing surfaces, each of the surfaces having a flat or a three-dimensional shape. The at least one surface may include those with shaped or grooved surfaces, and rough surfaces with surface-embedded inorganic dielectric particles, or dielectric polymer-based composites with inorganic dielectric fillers. The three-dimensional shape may be a shaped or grooved surface.

The method comprises controllably carbonizing the at least one surface of the member in a vacuum environment through ion bombardment with simultaneous surface renewal in a dynamic way, by bombardment of the at least one surface with an ion beam formed in a gaseous linear high-current technological ion beam source of noble gas and simultaneously added predetermined amount of a carbonaceous gas in the same ion beam gas admixture in order to achieve a treated carbonized surface layer with a uniform surface resistivity in a charge dissipative range.

Controllably carbonizing and simultaneously, i.e. constantly, renewing the surface(s) enables achieving charge dissipative surfaces of the member (i.e. a material or product) being durable and able to keep these properties for at least one year in laboratory environment that defines the shelf life warranty as at least one year after the treatment.

Furthermore, controllably carbonizing and renewing the surface of polymer- or composite-based materials enables achieving charge dissipative properties without changing its mechanical and bulk properties.

According to a further embodiment of the method, the ion beam may have an energy of 2.5 to 3 keV.

According to a further embodiment, the surface layer may comprise a charge dissipative range of dozens MOhms/sq at room temperature.

According to a further embodiment, as carbonaceous gas acetylene may be used.

According to a further embodiment, the out-gassing of a polymer-based material of the member may be produced in a vacuum environment, with follow-up heating up to a temperature in a range between 50° C. and 75° C., in particular 65° C., during the bombardment of the at least one surface so as to reduce the treatment time and enhance the carbonization quality.

According to a further embodiment, controllably carbonizing simultaneously and renewing the at least one surface of polymer- or composite-based materials of the member enables to achieve charge dissipative properties by using only inert gases and elements already present in the polymer-based surface. As an advantage, no metals or metal impurities are required.

According to a further embodiment, the method is applied to members made of copper strips laminated between Polyimide-based self-adhesive foils, e.g. Pyralux Coverlay LF0110, which is intended to be used in electric and electronic applications, e.g. as flexprints or flat cable conductors, to produce charge dissipative surfaces while preserving mechanical and electrical bulk properties of these standard products.

According to a second aspect of the present disclosure, a member made from or consisting of a dielectric polymer-based material which is intended to be used in space or other extreme environments is suggested. The member comprises at least one surface, in particular two opposing surfaces, each of the surfaces having a flat or a three-dimensional shape and a charge dissipative carbonized surface layer on the at least one surface with a uniform surface resistivity.

As an advantage controllably carbonizing and renewing the surfaces according to the method described above enables a member having charge dissipative surfaces which are durable and able to keep the charge dissipative properties for at least 15 years in GEO environment, as required for modern GEO space missions.

According to a further embodiment, the dielectric polymer-based material having the treated carbonized surface layer(s) is durable at thermal cycling and keeps the charge dissipative surface properties in a space-related temperature range of at least +/−150° C. (i.e. a temperature range from −150° Celsius to +150° Celsius).

According to a further embodiment, the carbonized polymer-based or composite surface is a charge dissipative material surface with slightly darker visual appearance compared to untreated state-of-art members having no carbonized surface, but without any change of surface morphology.

According to a further embodiment, the carbonized polymer-based or composite surface is a charge dissipative material surface without any change of thermal emittance and with some changes of solar absorptance in a way that does not cause any significant differences in the final thermal optical characteristics in comparison with the pristine ones, after both of them being tested in a ground-based GEO simulation facility for at least 15 equivalent years of GEO space exposure.

The disclosure herein is based on the consideration that it is not only necessary to make both (or all) surfaces of a member, such as a FCC, charge dissipative, but also to make sure that the applied surface treatment(s) does not modify in any way the electrical properties of functional parts, such as copper conductors, and does not change a polymer film thickness, as well as other functional properties. In order to avoid formation of leakage currents between copper foil conductor edges and a polymer matrix of the FCCs, all free Cu strip ends of the FCCs have to be masked during the ion beam treatment, when using the current disclosure herein.

Electrostatic charging problems can be solved and even eliminated in the first place by the present disclosure when used for surface treatment of dielectric polymer composites with inorganic particulate or fiber fillers, or various products made of them. For those composites the dielectric particulate fillers are not only on the surface or embedded in it, but are distributed almost uniformly in the materials volume.

In other words, the disclosure herein provides a single or two-sided dielectric polymer-based surface of material, film, or product with charge dissipative property, without changing any other functional properties, by ion beam treatment with dynamic surface renewal during formation of a carbonized surface of polymeric materials, films or products with shaped/grooved polymeric surfaces, and on rough surfaces with surface embedded inorganic particles, or of dielectric polymer composites with inorganic particulates or fiber fillers, and more particularly a method providing single or two-side charge dissipative surfaces with product-specific surface conductivity selected in a range of required values and being charge dissipative in a wide temperature range, such as the surfaces with properties that are needed for polymer-born Flat Cable Conductors (FCCs) or dielectric polymeric composites-based external spacecraft components, with long-term durability of this and other functional properties during extended missions in GEO space environment and when working in other extreme environments.

The disclosure herein has a plurality of advantages, including the following advantages.

An advantage of the present disclosure is that a method is established to provide charge dissipation for shaped/grooved or rough dielectric surfaces of polymers and polymer-borne products, including those with embedded inorganic particles, or on surfaces of dielectric polymer-based composites with inorganic particulate or fibre fillers, with the provided surface charge dissipation durable in a wide temperature range, such as, at least, of the (space-related) range +/−150° C., at multiple thermal cycling, and for a long-term, ~15 years durable under GEO space radiation and in other extreme environments. These advantages are achieved by an ion-beam surface treatment that combines simultaneous noble gas ion beam surface bombardment from a technological linear gaseous ion beam source and surface renewal from the same source in an adjustable dynamic manner, adding a required amount of carbonaceous gas in the ion source admixture. This is done in order to compensate the preferential organics sputtering and prevent the shadowing effect of the grooves edges and walls, and the effects of increasingly "sticking out" of the embedded inorganic particles during ion bombardment, that is strongly shadowing the ion beam treatment of the polymer, making difficult to provide surface carbonization and, therefore, charge dissipation property of a thin external layer on the surface. The surface treatment is done in vacuum by ion beam of rare gases, preferably Ar, adding selected amount of carbonaceous gas, in particular, acetylene, in the ion beam source admixture, and at specially defined treatment conditions.

Another advantage of the present disclosure is that the method is providing the selected surface resistivity in the charge dissipative range on one or both surfaces of a polymer-based material, film, or product and does not change any dimensions of the treated target.

A further significant advantage of the present disclosure is that the method of making the mentioned above polymer-based grooved or grooved/"contaminated" and damaged surfaces, or polymer composites surfaces charge dissipative allows providing a particular desired surface resistivity in the charge dissipative range of dozens MOhm/sq at room temperature.

Still another advantage of the present disclosure is that the method of making the charge dissipative single or double-sided polymer-based products or composite materials allows other functional properties of material/product to remain essentially unaffected, such as, for example, of the other functional properties of double-sides treated FCCs.

Another advantage of this disclosure herein is that for a single or double-sided material or product, such as, for instance, an FCC, treated in accordance with current disclosure herein, the surface resistivity is kept in the charge dissipative range in a wide temperature interval, in particular, in the space-related temperature-range of +/−150 C, and has been shown to be resistant to and durable in imitated GEO environment for a GEO space equivalent time of, at least, 15 years, so the treated FCCs and other products, treated according to current disclosure herein, can be used successfully in modern long-term, at least, 15 years long GEO space missions.

Another advantage of this disclosure herein is that for a single or double-sided material or product, such as, for instance, an FCC, treated in accordance with present disclosure, the temperature of the sample can be kept at temperatures well below 100° C.

Controllably carbonizing the polymer-based or composite surface mentioned above enables to achieve a charge dissipative material surface with slightly darker visual appearance, but without any change of surface morphology and thermal emittance, and with some change of solar absorptance in a way, that does not cause any significant difference in the final thermal optical characteristics of the treated FCCs in comparison with the pristine ones, after both of them being tested in a ground-based GEO simulation facility for 15 equivalent years of GEO space exposure.

A further advantage of the disclosure herein is that the depth of the charge dissipative layer is controlled by the energy of the noble gas ions and remains within the range of dozens of nanometers without changing the bulk properties of the treated item. The created layer is stable under thermal cycling and keeps its charge dissipative properties at least in a temperature range of −/+150° C. in inert atmosphere or vacuum.

The most successful treatment approach and conditions found in the current disclosure herein were used for treatment of both sides of a representative amount of 50 short and long FCCs, and all testing results allowed to evaluate the developed surface treatment's full reproducibility and stability, showing, in addition, the stability of the SR of the treated surfaces for at least one year in a regular laboratory environment, that means having a shelf life warranty for at least 1 year long.

BRIEF DESCRIPTION OF THE DRAWINGS

Further aspects and advantages of the present disclosure will become better understood with reference to the description in association with the following Figures in which similar references used in different Figures denote similar components, wherein:

FIG. 6a, 6b Planar Scanning Electron Microscopy analysis of the back side of FCC sample after ion beam treatment as secondary electron SEM images showing surface morphology at two levels of magnification.

FIG. 9a A first table illustrating the elemental composition of pristine Kapton 100HN surface from an XPS survey in FIG. 7.

FIG. 9b A second table illustrating the elemental composition of (Ar+C$_2$H$_2$) ion beam treated two front surfaces of FCCs by XPS survey (in FIG. 8 and FIG. 9).

FIG. 9c A third table illustrating the elemental ID at high resolution quantification for carbon C1s state in case of (Ar+C$_2$H$_2$) ion-beam surface treatment of an FCC.

FIG. 10bA and FIG. 10bB A fifth table, encompassing FIG. 10bA and FIG. 10bB, illustrating an overview of surface resistivity values of 50 both sides ion beam treated FCCs obtained with method B.

FIG. 17a A ninth table illustrating thermal optical characteristics of ion-beam treated (sample #1) and pristine (sample #2) FCCs before GEO imitating testing.

FIG. 17b A tenth table illustrating thermal optical characteristics of a pristine, ion-beam treated, and GEO tested FCC samples, selected from the first set.

FIG. 17c A eleventh table illustrating thermal optical characteristics of ion beam treated FCCs before and after 15 years of GEO simulated testing for samples, selected from the second set.

FIG. 17d A twelfth table illustrating surface resistivities of ESD tested FCCs.

DETAILED DESCRIPTION

Figure 1:
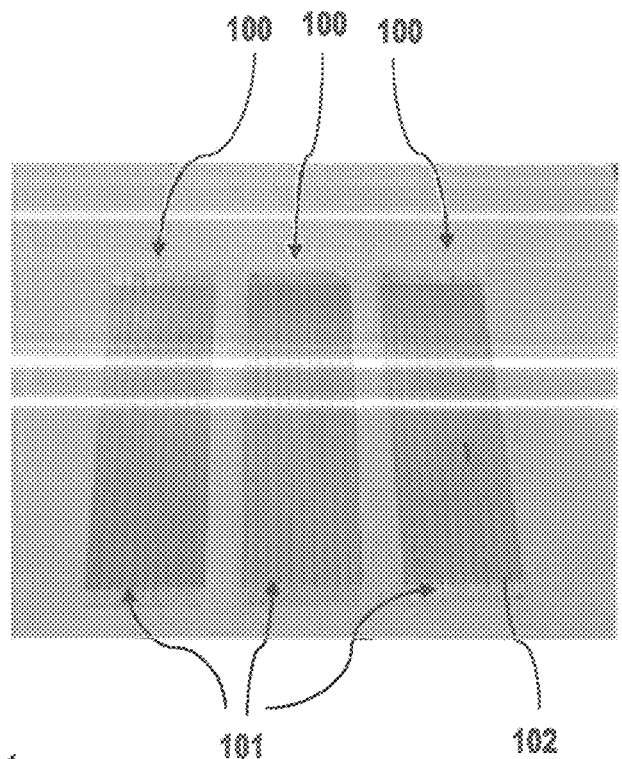
FIG. 1 Optical images of front surfaces of randomly selected Flat Cable Conductors (FCCs).
Figure 2:
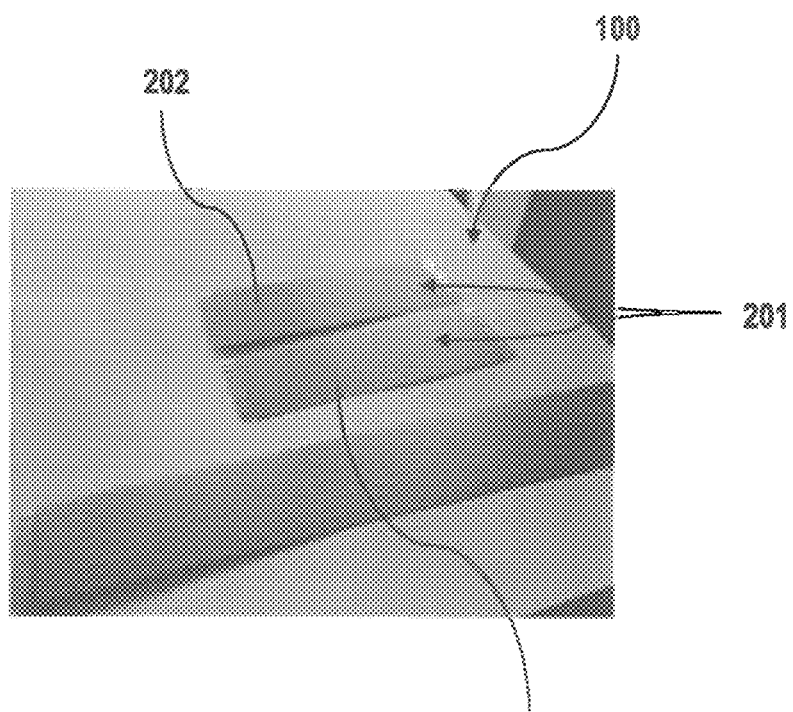
FIG. 2 Optical images of back surfaces of randomly selected short and long FCCs.
Figure 3A:
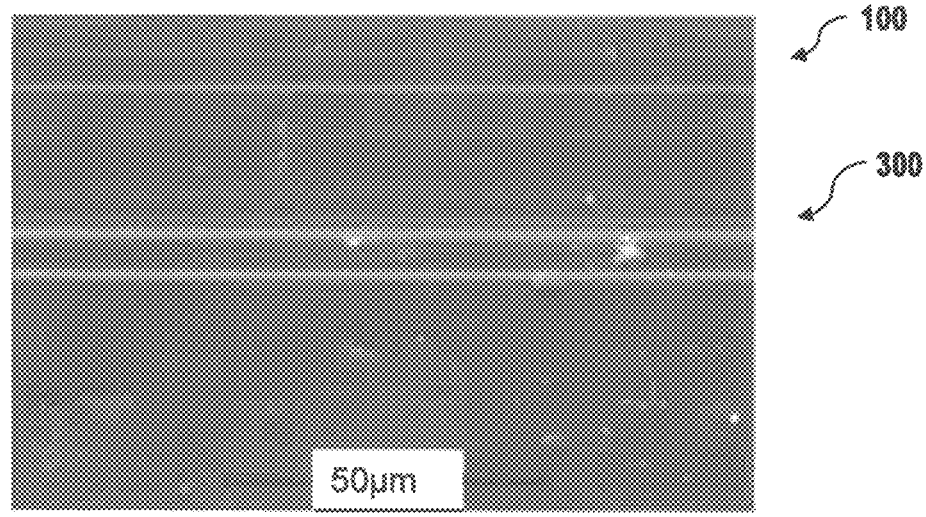
FIG. 3a, 3b Planar Scanning Electron Microscopy (SEM) analysis results of an "As Received" FCC front side as secondary electron SEM images showing surface morphology at the front side of the sample at different magnifications.
Figure 3B:
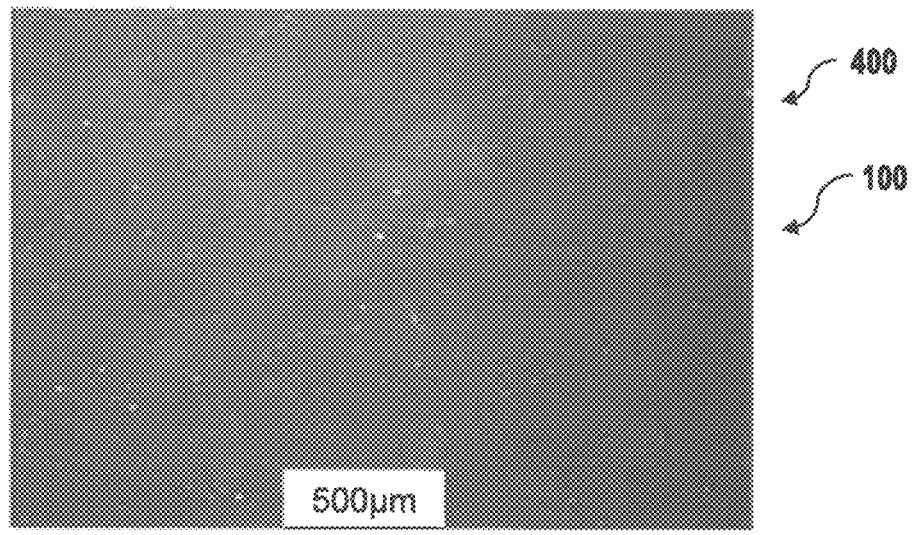
Figure 4A:
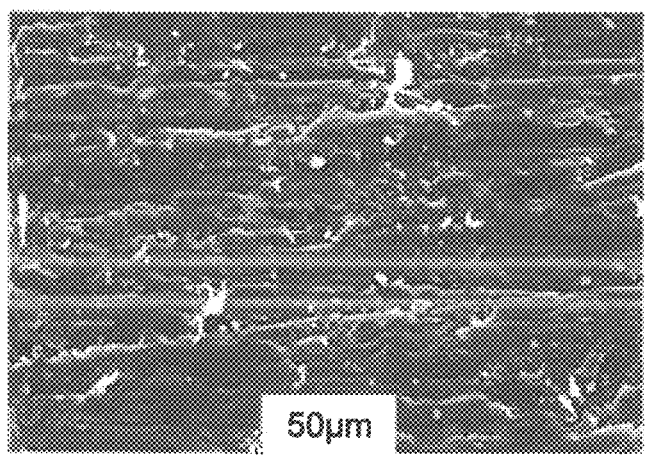
FIG. 4a Planar Scanning Electron Microscopy analysis results of an FCC sample in "As Received" condition as enlarged secondary electron SEM images showing surface morphology at the back side.

It has been found, that for all FCCs from a few manufacturing sets a significant difference appeared between the shiny front surface and rough, matt and "grayish", "contaminated" back surface (FIG. 1 and FIG. 2). The back side surface roughness and dark color, in addition, differed from one manufactured set of samples to another, and have been non-uniform even along every FCC sample (see FIG. 2). Hence, differences between the regular plain Kapton 100HN film surfaces and the real surfaces of the FCC's that included features such as the formed "grooves" on both sides, the presence of embedded inorganic particulate "contaminations" (pumice powder particles, as can be seen below) and strong roughness of the back side, the temperature sensitivity of the adhesive, used in FCCs manufacturing, as well as Cu contacts masking issues—had to be considered.

The state-of-art FCC manufacturing technology involves two abrasive cleaning steps that are required to obtain good adhesion properties of the copper surface for the subsequent steps in adhesive bonding. This is done with pumice stone "powder" particulates water slurry that is sprayed under high pressure on the FCC subassembly (from both sides), similar to same in the manufacturing line of printed circuit board (PCB) manufacturing technology. This explains the difference in appearance and roughness of the back surface, as well as the presence of incorporated pumice particles, since the polymer film at the back side is exposed twice to this treatment.

Due to strong preferential sputtering of the polymer matrix compared to the pumice particle during ion beam treatment, the pumice particles in the surface/subsurface layers become exposed and do not allow achievement of SR (surface resistivity) comparable to the treated front surfaces.

It is therefore important that not only the influence of the grooves on both sides of FCCs on the uniformity of the surface resistivity resulting from the ion beam treatment is reduced or even eliminated, but also that the problem of surface roughness and presence of "embedded" pumice particles on the back side before or in the process of ion beam surface treatment technological steps of the current disclosure herein is tackled. Attempts to clean the back surfaces that involve mechanical, chemical and combined mechanical/chemical treatments are unsuccessful in removing the pumice particles. This precludes to subsequently use state of the art means to treat this surface. The method according to the disclosure herein which is described below leaves all the FCCs original polymer films thickness intact after an ion beam treatment and achieve desired SR values and uniformity on both FCC surfaces and, at the same time, satisfies all other FCCs functional requirements.

The surface treatment according to the present disclosure is done by a combination of ion beam treatment and a sophisticated approach of a "constantly renewed carbonized surface", that allows to compensate the organic surface preferential sputtering in a dynamic fashion, i.e. during the treatment. This is achieved by using the same gaseous ion beam source, but changing the gas composition by constantly adding of a carbonaceous gas—in this particular case acetylene—to the noble gas Ar supplied in the source. The carbonaceous gas dissociation in the plasma inside of the ion beam source provide the accelerated C-containing ions for the dynamic renewal of the grooved surface or grooved surface with embedded inorganic (pumice) particles to prevent the angular dependent surface sputtering and the shadowing effects, allowing at the same time the surface carbonization processes to happen in the organic polymer part of the thin subsurface layer underneath the constantly renewed surface.

Surface carbonization is a very wide associated term in regards to ion beam treatment of polymers. It covers a wide range, from few percent of exceeding carbon concentration up to almost full "graphitization", with significantly variable amount of chemical bonding reconstruction, such as from $sp^2$ to $sp^3$ carbon bonding states, in polymeric surfaces and subsurface regions, depending on a variety of ion bombardment conditions. The final treated surface layers may be different in composition, structural specifics and final properties. Furthermore, due to the variable degrees of carbonization, various thicknesses of the modified subsurface layers due to ion beam energy and the gaseous diffusion processes, the final change of elemental chemical composition and chemical bonding re-structuring is also sensitive to the temperature during bombardment. Therefore final functional properties of the polymer-based treated surface, such as surface resistivity, thermal optical properties, durability and radiation resistance can vary drastically.

An ion beam surface treatment methodology according to the disclosure herein is described below.

It is known, that during the technological ion-beam surface treatment procedures, to reduce the treatment time, the samples should be exposed to high current energetic ion beams that is leading to significant surface sputtering and to elevated temperature. In addition, many ion-beam treatment facilities contain heating sources to be utilized at certain stages in the process. For example, some treatment stages at elevated temperatures may be used. However, strict temperature limitations have to be followed in the current disclosure herein, i.e. not more than 110° C., defined by the special adhesive used in FCCs production, even so the Kapton polyimide is a high-temperature polymer, stable in vacuum up to more than 300° C. A special thermal control sensor is therefore incorporated and used in the vacuum chamber, out of the "line of site" of the ion beam.

Since Kapton polyimide normally contains a significant amount of absorbed water vapor, specific attention has to be paid to the out-gassing procedure. High vacuum ion beam treatment with surface renewal can easily be disrupted by the presence of minor moisture amounts due to samples dehydration and out-gassing of trapped air bubbles in the vacuum chamber. Therefore, each treatment is conducted following a timely, normally 2 hours, high vacuum out-gassing stage, where the FCCs temperature is kept around 35° C. Then, without breaking the high vacuum, the FCCs units, attached to a rotating drum, are treated by an ion beam of Ar with added acetylene (C2H2) in the amount of 8% (by vol %)

a) The KVARC-700 high-vacuum facility, equipped with a rotating 0.5 m wide stainless steel drum, low-to-medium ions energy high-current technological linear gaseous ion beam source and an independent heater, can be used in the process according to this disclosure herein.

Designated, polyimide pressure sensitive tape with silicone adhesive (CGSTAPE-8358, 1 inch) can be used for taping the FCCs to the drum. The Cu foil contacts will be masked with the tape, including 2.5 mm+/−1 mm of the upper (polymer) surface, adjoined to the Cu contacts.

Then the facility door is closed, the vacuum pump turned on, and, after the required vacuum of $\sim 3 \times 10^{-3}$ Pa is reached, the pre-heating of the FCC's is performed by turning on the heater directed towards the rotating drum. Pre-treatment heating up to 35° C. in high vacuum was performed and continued for around 2 hours for enhanced out-gassing of the FCCs, with temperature control performed by a specially calibrated thermo-sensitive sensor unit located inside the vacuum facility. The following ion beam treatment is performed with a linear type gaseous ion source that is working on a calibrated mixture of Ar and a carbonaceous gas (acetylene) under the process parameters and for the duration indicated below. After treatment completion, that was experimentally found to be the best to perform for ~16 minutes, the ion beam is turned off, as well as the vacuum, and the door opens automatically after finishing the treatment, to allow the FCCs and drum temperature measurements for final temperature control confirmation. After measuring the temperature, that should not exceed 62-65° C., the FCCs have to be left on the drum for cooling approximately ~30 min, and are then taken off the drum to perform the measurements of SR of the carbonized top surface layer. Meanwhile, the Ar ion beam bombardment can be used to clean the drum in preparation for the next treatment step.

b) The front surface resistivity values around ~10 MOhm/sq, achieved by the treatment using the current disclosure herein, remained unchanged after the FCCs have been turned over, attached again to the drum, with the treated front surfaces facing the already cleaned drum, and the back surfaces exposed to a similar procedure. In such a way, the required both sides treatment of FCCs used for space solar arrays applications can be successfully achieved by the current disclosure herein. The nominal best FCCs treatment results have been reached at the following treatment parameters:

Facility: KVARC-700; Ion Beam Gas Mixture of Ar (92 vol %)+acetylene, 8 (vol %);

Ion Beam Energy—2.5-3 (keV); Ion Beam Current—195 (mA); Bias on the drum −150 (V)

Temperature: <65° C.; Ion beam treatment duration—around 16 (min):

Now, the post-treatment SR measurement will be described.

Removal of each treated FCC from the drum has to be done very carefully to avoid any damage to them. The units are placed on the SR measurement table, covered with a soft (thick resin) cloth and a clean paper sheet. All SR measurements are conducted using a special Probe Unit that was used successfully for a number of years on polymer films or comparatively small samples/products with polymer films at the top. The unit can be similar to the one described in [9]. Post-production SR measurements are performed right after placing the FCC unit on the table, using the calibrated SR measurement unit, and a Digital Multi-meter (Uni-Trend Technology, Model UT55) with a custom surface resistivity measurements probe or Hewlett-Packard 4329A High Resistance Meter at a voltage V=100V with the same custom surface resistivity probe.

The same treatment procedure has to be applied to the back side and post-treatment SR measurements then are performed, with the typical SR in the range of 10 MOhm/sq. to 20 MOhm/sq. The FCCs are considered as successfully treated on both sides, if no visual defects appeared on both surfaces, and the SR values everywhere on all treated FCCs front and back surfaces are below 80 MOhm/sq.

It is possible to confirm by the follow-up SR measurements, that Surface Resistivity on both sides of a treated FCC does not change for at least 1 year or more when kept in normal laboratory environment. This is a confirmation of at least 1 year shelf life warranty for the treated FCCs charge dissipative surface properties provided by this disclosure herein.

Ion bean treatment is a very versatile technology that is used for various surface modification options, and has such an ability as to change sometimes drastically the surface morphology, that might be both a desired effect or a side effect to be eliminated, depending on the applications. Some darkening might occur on both sides of the treated FCCs. Such a visual effect may be associated either with morphology or with surface composition change by the treatment.

Figure 5A:
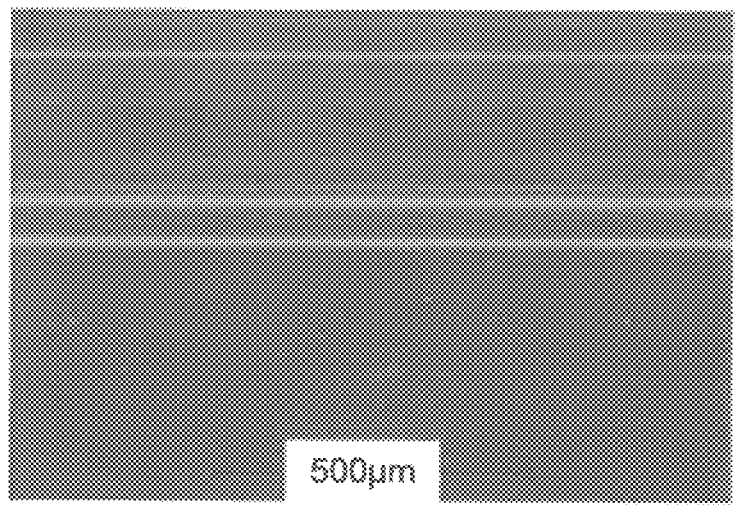
FIG. 5a, 5b Planar Scanning Electron Microscopy analysis of the front side of FCC sample after ion beam treatment as secondary electron SEM images showing surface morphology at two levels of magnification.
Figure 5B:
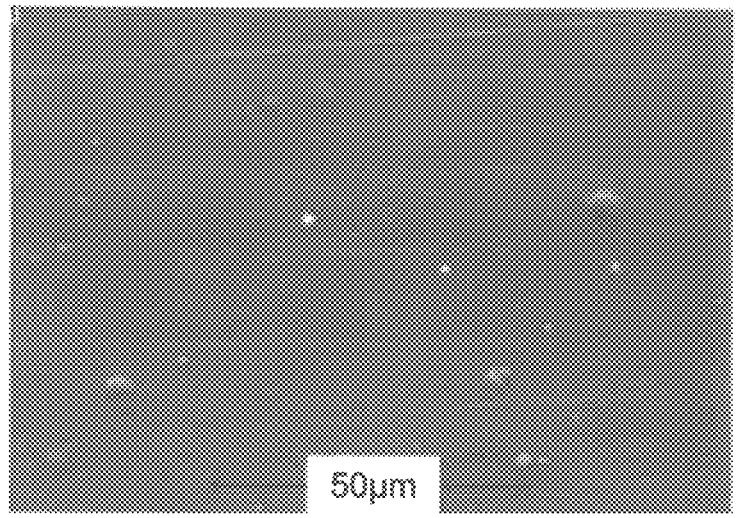

By the follow-up surface analysis it can be shown that another important part of the current disclosure herein is the absence of any influence of the developed ion beam treatment with surface renewal on the surface morphology of both treated FCC surfaces. The results of SEM analysis performed on the treated FCCs and presented in FIGS. 5a and 5b for the front and FIGS. 6a and 6b for the back surfaces, and they fully confirm no change of surface morphology after the FCCs treatment on the rotating drum. Therefore, the post-treatment darkening effect can be mostly attributed to the elemental composition change—loose of light gaseous final products and possible chemical bonds reconstruction—surface carbonization.

Now, the results of a XPS analysis of a surface modified layer with regard to general surveys and high resolution results will be described.

To evaluate the expected carbonization effect after using the method described above for FCCs surface treatment, an XPS (X-ray Photoelectron Spectroscopy) analysis may be performed mostly on the front surface, to avoid the pumice contamination elements to affect the analysis of the treated surfaces. The XPS technique, that is used for the analysis of the elemental composition of the very top surface layer of a few dozen angstroms (and 50-100 angstroms in a polymer), can be performed on a Thermo Scientific Theta Probe XPS spectrometer (ThermoFisher, E. Grinstead, UK). The samples are run in standard mode and a monochromatic Al $K_\alpha$ X-ray source is used with a spot area of 400 µm or less, as required. Where necessary, charge compensation is provided utilizing the combined e$^-$/Ar$^+$ flood gun. Position of the energy scale was adjusted to place the main C 1s feature (C—C) at 285.0 eV. All data processing is performed using the software ("Avantage") provided with the instrument.

Figure 7:
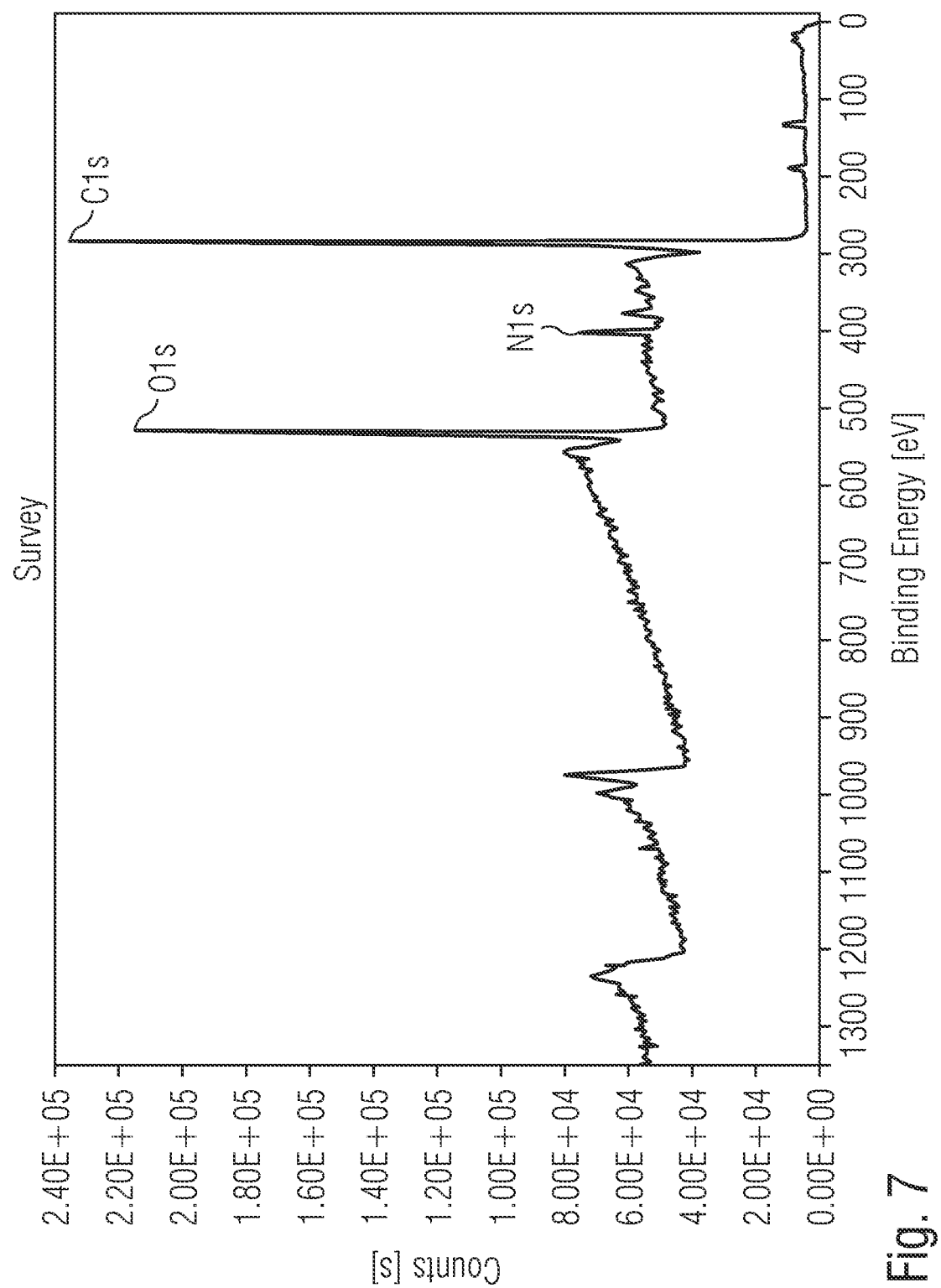
FIG. 7 An X-ray Photoelectron Spectroscopy (XPS) survey scan of pristine Kapton 100HN film.
Figure 8:
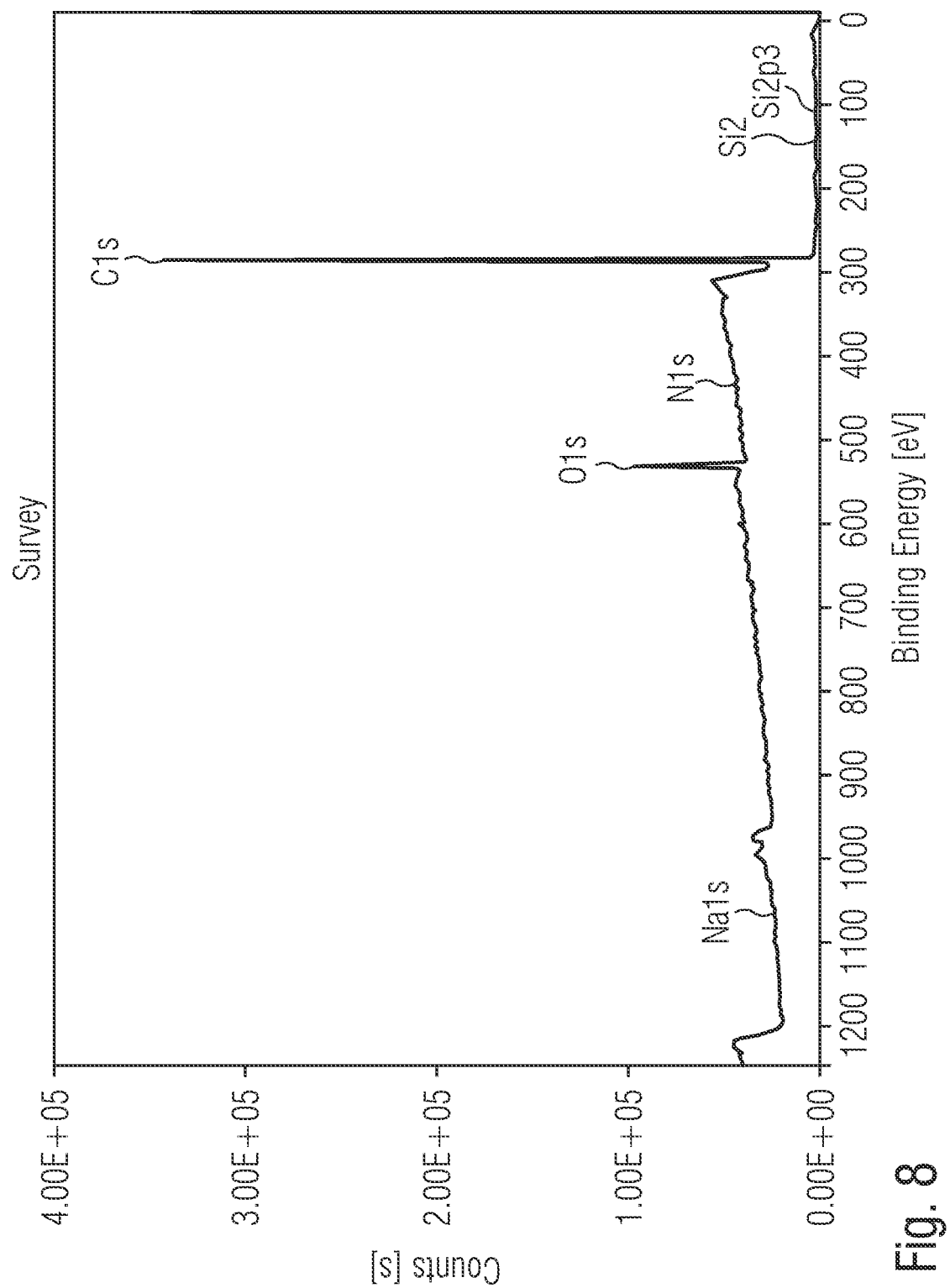
FIG. 8 An XPS survey scan of (Ar+C$_2$H$_2$) ion beam treated Kapton 100HN on the front surface of FCC (Spot 1).
Figure 9:
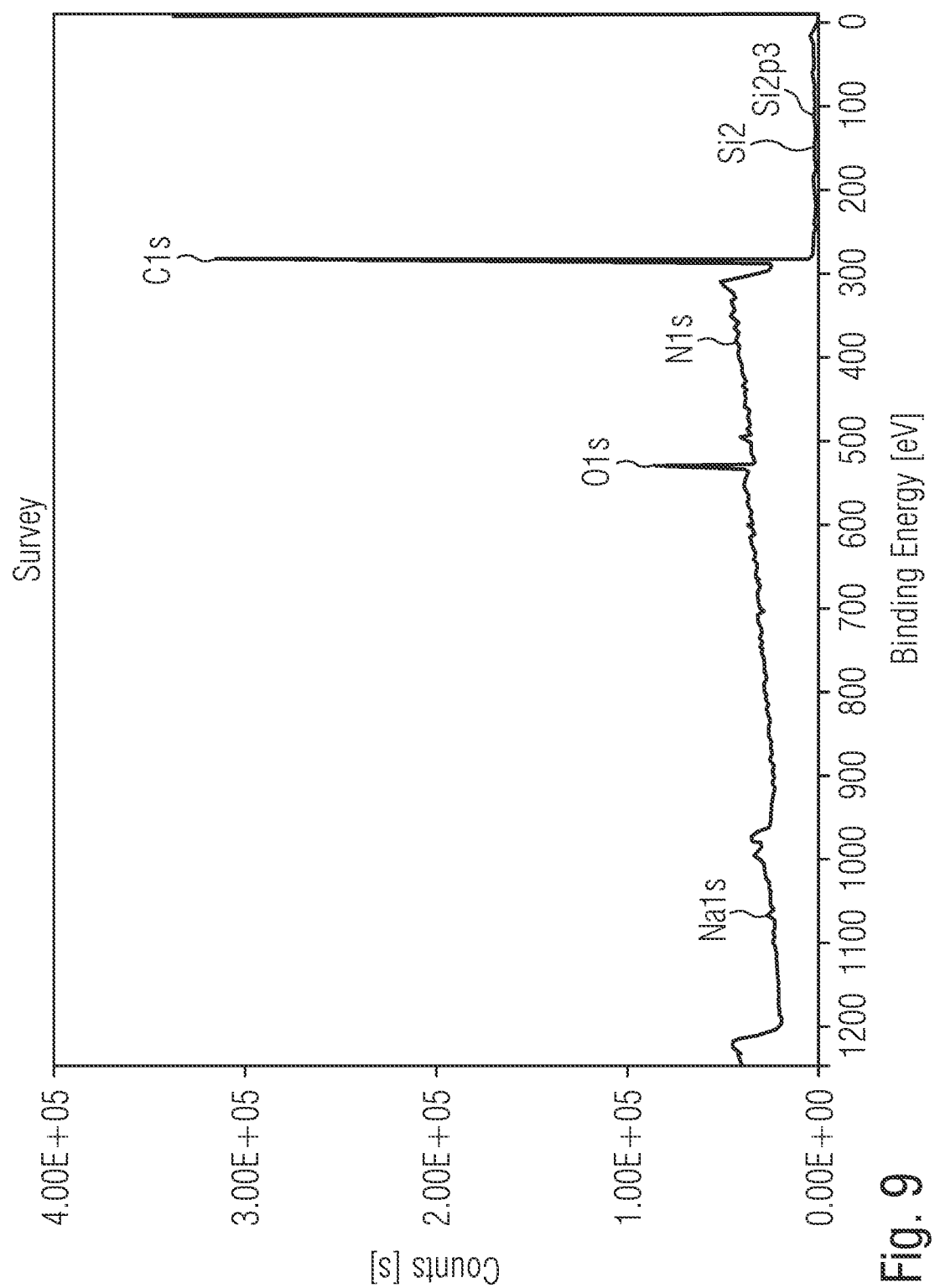
FIG. 9 An XPS survey scan of (Ar+C$_2$H$_2$) ion beam treated Kapton 100HN on the front surface of FCC (Spot 2).

Survey scans of pristine Kapton100HN (as a baseline for comparison) and ion-beam modified Kapton100HN from the front surfaces of treated FCC are presented in FIGS. 7 to 9, and the elemental compositions from the XPS surveys are given in the tables of FIGS. 9a and 9b.

The survey scan of pristine Kapton HN is shown in FIG. 7. Next survey scan, the one for the front surface of (Ar+C2H2) ion beam surface treated FCC, taken in the middle of the treated plain area on top of the Cu strip, is shown in FIG. 8. Making a comparison, total absence of N and Si, the drop in oxygen, and significant increase of C at the surface is seen after this treatment. Additional XPS survey scan results at another spot, taken from another randomly selected (Ar+C2H2) ion beam treated FCCs, are shown in FIG. 9, and are in good agreement with the results in FIG. 8, and fully confirm the strong carbonization effect causing the surface composition change of the FCCs treated by the current disclosure herein, as defined by XPS.

This means, that the very thin "virtual" carbon-rich layer, dynamically deposited and sputtered away during treatment, does not prevent the carbonization effect to happen under it, in the subsurface polymer layer, during ion bombardment. From the survey scans above and the quantitative results derived from them it is clear that for ion beam treated Kapton 100HN, located on top of the FCCs, the main element on the surface is carbon (91-92 at %), as a result of surface carbonization due to the performed treatment. Some oxygen is still present at the surface—from ~7 at % to ~10 at % that is indicative that the attained composition is due to the changes in the KaptonHN material and not to deposition of a carbon layer on the surface.

The de-convolution of individual peaks in high resolution XPS spectra is, usually, indicative of the amount of different types of chemical bonds for a specific element, indicated by the shifts of the binding energy. For instance, the de-convolution of the carbon peak, listed in the table of FIG. 9c, can be indicative of the presence of a high amount of "disturbed" C—C bonds (~85%), around ~10-12% of carbonyl C bonds with oxygen, and around ~2% of carboxylic C bonds with oxygen in the modified top surface layer.

In order to identify the thickness of the sub-surface layer a ToF-SIMS (time of flight secondary ion mass spectroscopy) depth profiling technique can be used. A carbon-profiling would be straightforward; however, the gradual transition of the carbonized layer to the pristine polymer represents a challenge for any clear distinction. The approach to use the depth distribution of the element from the ion source, in this case Argon, is not feasible because of the gaseous state leading to outgassing of Ar during the FCC treatment in vacuum. Therefore a tracer element, Silicon, is used, which can be implanted by mixing a small, tracing amount of Silane (SiH4) into the ion beam source working gas during ion beam treatment of a dedicated FCC sample for ToF-SIMS depth profiling analysis. Finally, the ToF-SIMS depth profiles are correlated with literature values [10] for sputtering of Kapton HN with Argon ions under similar conditions to derive the sputtering time-depth correlation. The depth of the ion beam treatment with constant surface renewal as applied on FCC products was determined to be about/below 50 nm. A theoretical calculation by using the TRIM code (Transition of Ions In Matter [9]) for implantation of silicon yielded comparable values and thus corroborated the experimental findings.

In the following, an evaluation of manufacturing a charge-dissipative layer on a FCC will be described in more detail.

In the description of the method according to the disclosure herein, the FCC was already featured as an example of a shaped/grooved dielectric polymeric surface with surface embedded inorganic particles or dielectric polymeric composites. It is the purpose of this section to demonstrate the features that can be obtained by the suggested process on the actual product FCC.

The purpose of the FCCs is to connect the power and signal harness in between panels and yoke of a solar array wing. As a consequence the FCC takes part in the deployment movement of the solar array wing in space. The key properties of the standard FCC are therefore linked to electrical and mechanical bulk properties. Due to the charging environment in space e.g. in geostationary orbit and the dielectric properties of Kapton (polyimide), the standard FCC builds up a charging potential during its in-orbit life. This represents a risk for electro-static discharge (ESD) or arcing towards the photovoltaic assembly and power connectors in close vicinity. Hereinafter, a set of 50 FCCs with charge dissipative surface obtained by the inventive process (innovative example IE) is characterized in its bulk properties and compared to standard FCCs (comparative example CE). The stability and performance of the charge dissipative surfaces was furthermore tested.

The comparative examples and the examples treated according to the disclosure herein were prepared as follows:

a) Comparative Example CE

The standard flat cable conductors (FCC) used on solar arrays of e.g. geostationary telecommunication satellites are procured. They consist of or comprise the following configuration:
Conductor: SE-Cu, blank, as rolled (DIN 1787/1791/17670), 127 µm±4 µm thickness
Cover foils: DuPont Pyralux Coverlay LF 0110 25/25—polyimide film with acrylic adhesive; 25 µm Kapton HN+25 µm adhesive; 50 µm±3 µm b) Inventive Example IE 50 standard FCCs, identical to the CE, with different sizes (105 mm, 205 mm) are treated with the following ion beam process:
Facility: KVARC-700 high vacuum with rotating drum (0.5 m wide, stainless steel)
Process Conditions:
  starting vacuum approx. $3\times10^{-3}$ Pa; 2 hours of vacuum bake out at 35° C. before treatment
  linear type ion beam source with a mixture of argon (92 vol %) and acetylene ($C_2H_2$, 8 vol %)
  ion beam energy 2.5-3 keV; ion beam current 195 mA; bias on drum 150V
  temperature<65° C.; duration of treatment 16 min
  second surface treated in separate process run with same process conditions
  fixation of FCCs to drum and masking of copper ends and adjacent rim of Kapton surface with polyimide pressure sensitive tape with silicone adhesive (CGSTAPE-8358, 1 inch)
The 50 FCCs were treated in several process runs on both sides.

Figures 10, 10A:
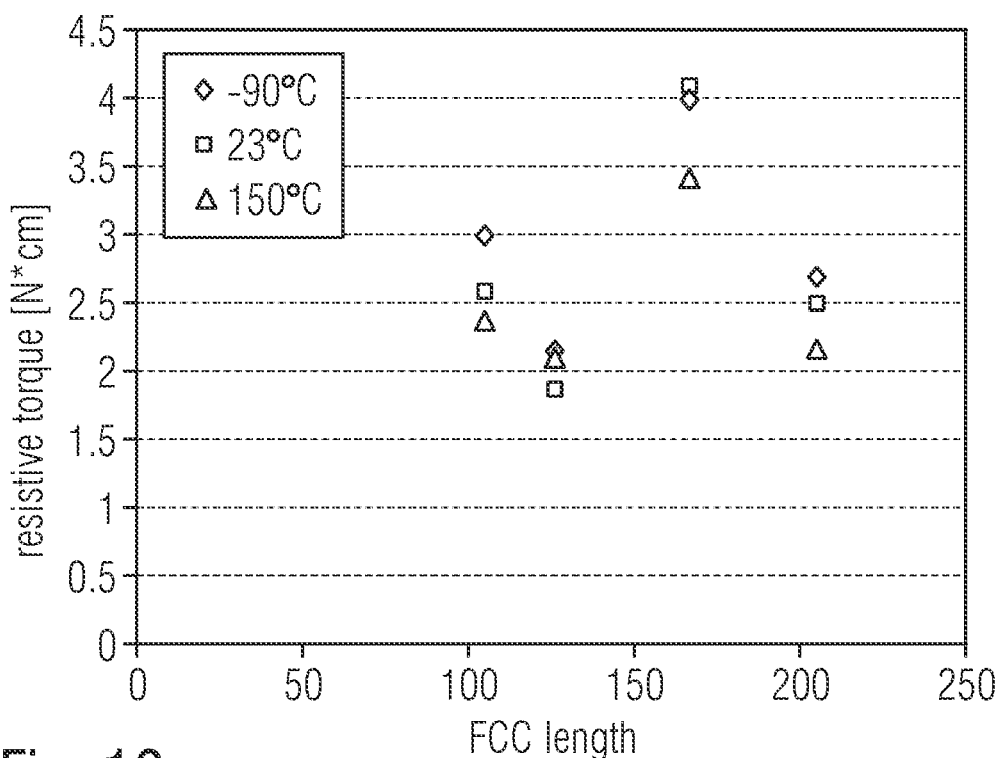
FIG. 10 Resistive torque values of standard and charge dissipative FCCs, with both sides treated by the method of current disclosure herein.
FIG. 10a A fourth table illustrating a comparison of surface resistivity measurement results for front and rare surfaces of ion beam treated FCCs by methods A and B.

IE and CE were compared in all bulk and surface properties relevant for their application as an interpanel connection in a deployable solar array. A summary of the results is given hereafter.
Mechanical and Electrical Bulk Properties:

The resistive torque of ion beam treated FCCs was measured at different temperatures (−90° C., 23° C., and 150° C., FIG. 10) and compared to results of standard FCCs. The resulting small values for the different configurations (with different length) lie close to the values of the standard FCCs and show in general no impact on the deployment.

The resistive torques of the ion beam treated FCCs were also determined after 10 thermal cycles between −175° C. and 150° C. They remained unchanged within measurement precision. A standard test for FCCs to demonstrate robustness during folding operations is called flexural strength test (5 cycles of 40 folding operations). It consists in or comprises repeated folding around a mandrel with specified diameter, in this case 3 mm. The treated test samples passed this test successfully. It was demonstrated that the present disclosure as applied on standard FCCs had no impact on their mechanical bulk properties.

The relevant electrical bulk properties of the FCC consists in or comprises the continuity of the copper conductors, the insulation resistance between copper to copper conductor, and the insulation resistance between copper conductor and Kapton cover foil.

These properties were determined for all ion beam treated FCCs that underwent any testing activity. All treated FCCs passed the continuity test (measurement on individual copper lines, voltage drop at 100 mA). The insulation resistance between copper to copper conductors was measured by alternating connection of the individual copper lines to a positive and negative pole with a bias voltage of 500V. The obtained values were all above 20 GO in accordance to the properties of the standard FCC. The resistance between copper conductors and Kapton foil was measured by a wet sponge method. In this test the copper lines are connected to one pole and the Kapton foil is connected to the other pole applying a sponge electrode soaked in a mixture of water and ethanol. The applied bias voltage was 500V. The obtained resistance values were again as for the standard FCCs above 20 GO. The continuity and resistance (copper to copper, copper to Kapton) of the different tested charge dissipative FCCs were again determined after the following tests:
  Thermal cycling between −175° C. to 150° C.
  Flexural strength (5 cycles of 40 folding operations)
  Humidity test 60° C., 90-95% relative humidity, 96 hours
  Storage in clean room environment with climate control for 180 days in folded condition representative for a folded solar array wing The results obtained after these exposure tests remained in accordance to the standard FCC (no discontinuity, resistance values above 20 GΩ). Therefore, the electrical bulk properties of the standard FCC are not impacted by the inventive process to obtain charge dissipative surfaces.
Surface Properties:

The surface resistivity was determined by a two point probe and a bias voltage of 100V. In order to obtain good contact to the non-planar and microscopically rough surface (back side of FCC) the electrodes were chosen to be of soft conductive silicone foam (method A). A second method using metallic electrodes and a soft non-conductive pad underneath the charge dissipative FCCs (method B) yielded also good agreement of values compared to the first method, as shown in the table in FIG. 10a.

The surface resistivity was measured on the small FCCs (105 mm) in the center. Three measurements along the 205 mm FCC were taken. The table in FIG. 10b lists the surface resistivities obtained for 50 FCCs (note: The averages of three values for long FCCs are given; the maximum and minimum values cover all values). The upper required limit for the surface resistivity was derived from theoretical considerations and set to 80 MΩ/sq. The aim was to remain well below this requirement with values closer to 10 MΩ/sq. The method according to the disclosure herein allowed achieving this goal for both sides of the FCCs despite the non-planar surface and the difference on microscopic scale (roughness and inorganic contamination). Although the differences of the smooth front and rough back surfaces, contaminated to various degrees, could not be completely eliminated, the inventors managed to minimize their influence on the treatment results. This achievement can be considered as an exceptionally good outcome of the developed innovative treatment technology.

In comparison the surface resistivity of the untreated FCC with a pristine Kapton surface (CE) were in the insulating range $10^{15}$-$10^{16}$ Ω/sq.

Figures 10C, 11:
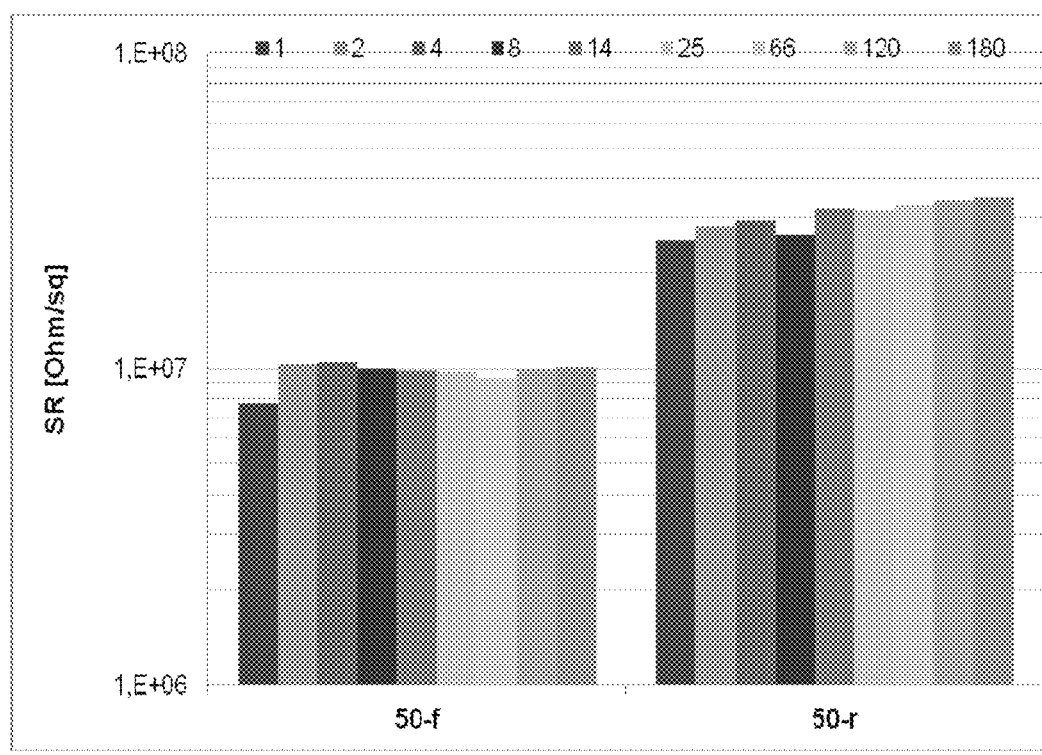
FIG. 10c A sixth table illustrating surface resistivities before and after humidity testing (60° C., 90-98% relative humidity) measured with method A.
FIG. 11 Surface resistivities during long term storage in clean room environment and folded condition as measured with method A.

The stability and performance of the surface resistivity was tested against the most relevant environmental conditions during on-ground and in-orbit life, namely:
Humidity (accelerated storage)
Long term storage in representative on-ground environment
Thermal cycling
Particle (protons, electrons) and UV radiation representative for geostationary orbit
Charging environment in geostationary orbit including worst case conditions were chosen that cover the qualification requirements for external surfaces in telecommunication satellite projects The surface resistivity remained stable against humidity testing. The data in the table of FIG. 10c shows some measurement related spread. This is especially true for the rough sides of the FCCs (see e.g. lower value after humidity test of 7 r).

A second aspect that has been tested was the stability of the surface resistivity in long term storage in a typical clean room environment with climate control and in folded condition. The surface resistivity was measured after 1, 2, 4, 8, 14, 25, 66, 120, and 180 days (FIG. 11). A stable behavior over this time frame is confirmed.

Similar measurement results have been obtained in parallel on randomly selected FCC samples preserved under laboratory conditions for 12 months. Controllably carbonizing the polymer-based or composite surfaces as described above enables to achieve a charge dissipative material surface whose resistivity behaves stable under typical on-ground tests and environmental conditions relevant for the FCC.

Figure 11A:
FIG. 11aA and FIG. 11aB A seventh table, encompassing FIG. 11aA and FIG. 11aB, is provided between illustrating the surface resistivity of FCCs before and after thermal cycling as obtained with method A.

SR Stability Under Thermal Cycling:

The table encompassed between FIG. 11aA and FIG. 11aB lists the surface resistivities measured with method A before and after thermal cycling. The values are unchanged (only minor differences due to measurement spread; note: The values deviate to some extend to the table encompassed between FIG. 10bA and FIG. 10bB because of the different measurement methods A and B, remain however within very good agreement for this range of surface resistivity).

Figure 12:
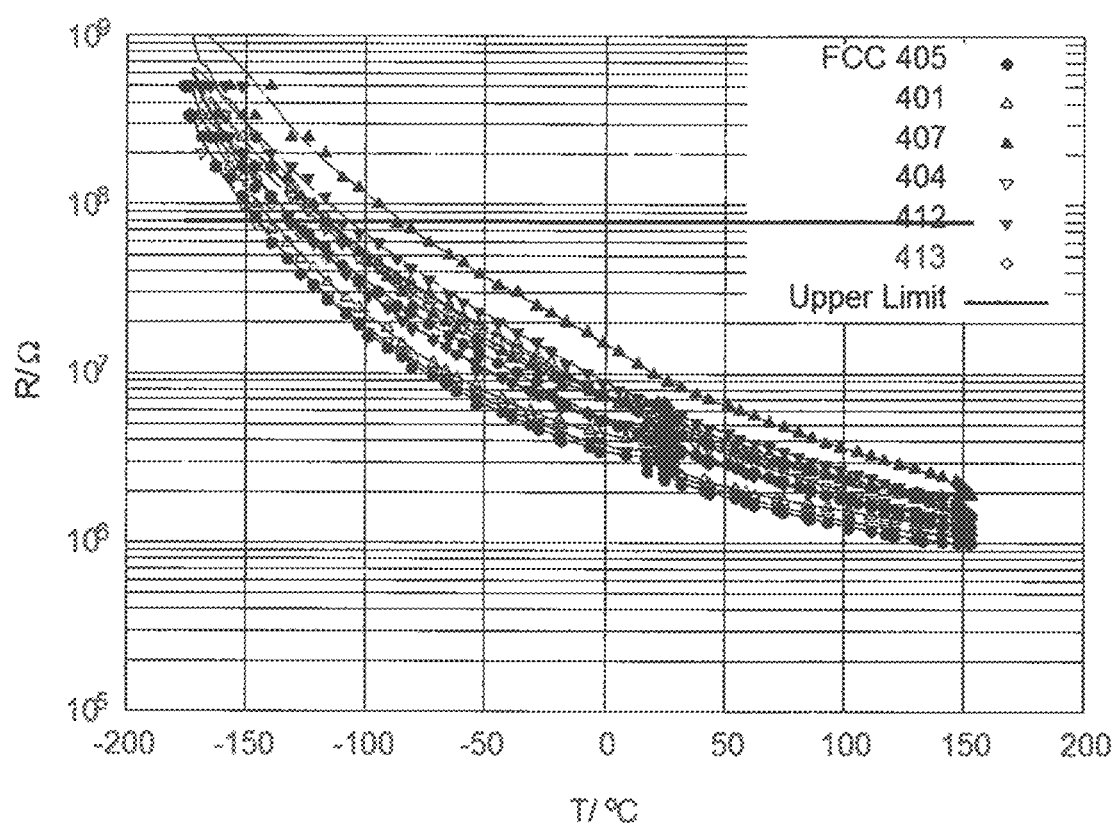
FIG. 12 Surface resistivity of FCCs during thermal cycling in dry nitrogen.

During thermal cycling (in dry nitrogen) the surface resistivity was measured in situ. FIG. 12 shows the dependence of the surface resistivity versus temperature. These results fully confirm that the surfaces of treated FCCs kept their charge dissipative properties through the entire temperature range. These data allowed identification of the surface conductivity mechanism using the approach of [16, 17]. The numerical approximations of 1/SR(T) curves lead to the conclusion, that the surface conductivity mechanism is, most possibly, a three-directional variable rate hopping conductivity mechanism, similar to the one confirmed for ion beam treated thin polymer films in [18].

SR Stability in GEO Simulated Conditions:

It is impossible to exactly reproduce the space environment for ground testing of space system elements because of the variety and complexity of the environments and their effects on materials. The reliability of test results depends on simulating the critical effects of the space environment for a particular mission. The main objectives of the simulation are to obtain test results that are adequate to the material behavior in a space environment and to use existing radiation sources and methods available in the test laboratory.

During the design of space systems, it is necessary to simulate long mission time in reasonable ground time. For this reason, it is necessary to perform accelerated tests. It is often required to use dose rates that may be orders of magnitude higher than in the natural space environment. The main requirement for the correct simulation in radiation tests involves simulating the correct effects on materials in space by considering the type, spectrum (energy), and absorbed dose rate of radiation.

Treated and untreated FCC units had been exposed to GEO-imitating environment following [12] using a unique testing facility. The samples and their results described herein were included in the test campaign in addition to the FCCs presented in the table encompassed between FIG. 10bA and FIG. 10bB. Therefore the labeling of the samples in this chapter is independent from the set of 50 samples. The GEO simulation facility was designed for studying physical-chemical properties of materials and coatings under separate and combined action of space factors that may influence the materials in GEO. Those factors to consider are vacuum as low as $10^{-5}$ Pa, electrons and protons with energies up to 50 keV, solar electromagnetic radiation up to 10 SEE (solar exposure equivalent) and temperature in the range of ±150° C.

Every set of randomly selected short FCC units had been placed in a special custom-made sample holder and subjected to combined irradiation consisting of or comprising protons, electrons and ultra-violet light. The first set of three FCC units had been subjected to 33 hours of combined $p^+ + e^- + UV$ irradiation, with proton energy $E_p = 20$ keV, current density equal to $J_p = 5 \cdot 10^{11}$ s$^{-1}$cm$^{-2}$, electrons energy $E_e = 40$ keV, current density of $J_e = 5 \cdot 10^{11}$ s$^{-1}$cm$^{-2}$ and with simultaneous UV exposure. The selected conditions correspond to a total proton fluence equal to $F_p = 6 \cdot 10^{16}$ cm$^{-2}$ that roughly corresponds to 15 years of equivalent GEO space exposure. Due to well-known limitations, the UV exposure was selected at 2 times the intensity of solar light. Temperature of the samples was kept around 52° C. during testing experiments.

Figure 13:
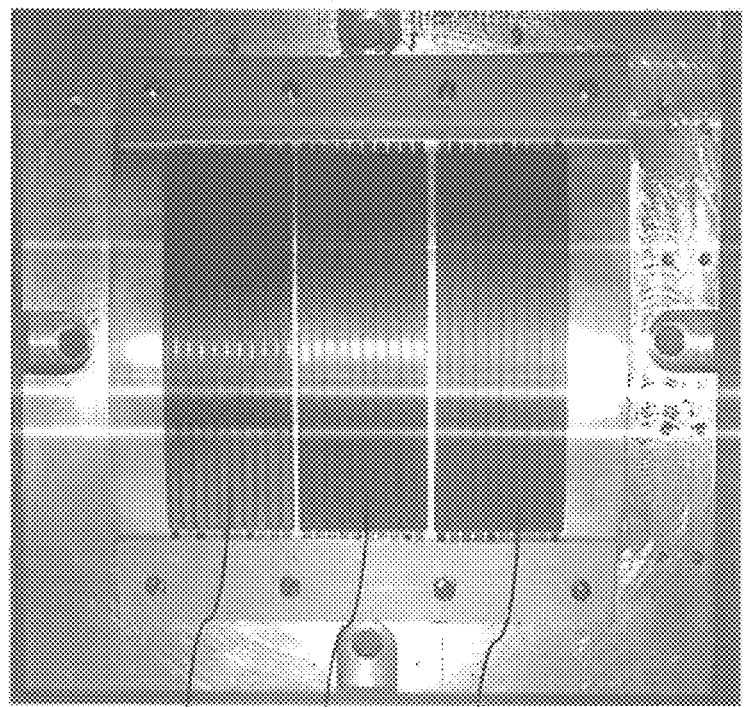
FIG. 13 Selected FCC samples (the first set) in the custom made sample holder, wherein the set was photographed after a simulated GEO testing equivalent of ~4 years GEO space exposure equivalent, and then put back for further testing.
Figure 14:
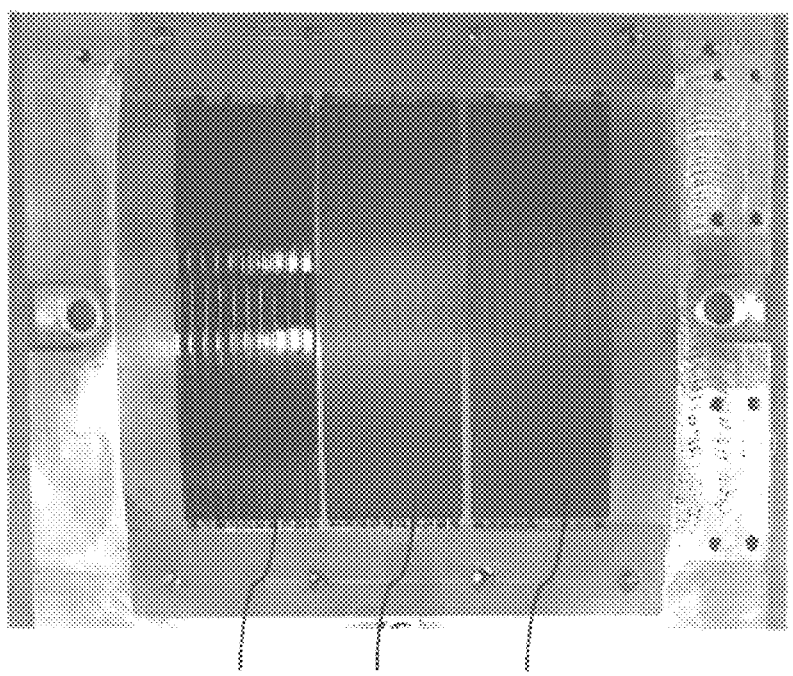
FIG. 14 The FCC samples (the first set) in the custom made sample holder after finishing the simulated GEO testing for 15 years GEO space exposure equivalent.

Photos of optical images of the tested first set of samples had been taken, and surface resistivity measurements performed after intermediate timing of ~4 years, and then after final 15 years of space equivalent GEO exposure. FIG. 13 and FIG. 14 show the results of the intermediate and the final appearance of the samples 1301, 1302, 1303 and 1401, 1402, 1403. Apparent visual differences (the degrees of darkening) demonstrate the increasing effect of simulated GEO radiation on the surfaces of tested FCC units. It is obvious that both sides of pristine (included in a first set) and ion-beam treated FCCs as included in the first and second set of samples and exposed to GEO-simulating environment, become darker after 4 years, and finally strongly blackened after 15 years of equivalent GEO exposure. The images in FIG. 14 clearly illustrate the visual differences between the front and back surfaces of tested FCC units 1401, 1402, 1403—the front side of exposed FCCs (1401) looked almost black, but remained glossy, while back surface looked dark grey-blackish, and remained matt (1402, 1403).

The second set of GEO tested FCC units, as it was mentioned above, included three ion-beam treated samples that have been tested up to the same 15 years of GEO simulated space equivalent exposure. Two short ion-beam treated FCC units (samples #51 and #52 in FIG. 15) have been exposed by back and front surfaces, correspondingly, and the back surface of a piece of ion-beam treated long FCC has been exposed as well, with this sample to be used later for surface analysis. One can see similar strong darkening on the second GEO tested set of samples, as was observed on the first one. The changes in quantitative characteristics of the ion-beam treated and GEO-tested units, such as surface resistivity and thermal optical properties have been evaluated.

Surface resistivity values were measured for all FCC samples for both GEO tested sets. The front and back surfaces of radiation exposed ion-beam treated FCCs and pristine samples (to have the baseline values for comparison and evaluation of the testing effects) were measured.

For tested pristine FCCs, after an equivalent of 4 years and 15 years of GEO space exposure, the SR values of the front and the back surfaces remained above $10^3$ MΩ/sq ($10^9$ Ω/sq), i.e. far above the required 80M MΩ/sq. For the second tested set, a decrease in measured SR values was indicated on all ion-beam treated samples after 15 years GEO space equivalent ground-based testing, and these results are presented in the table of FIG. 14a.

After 15 years of GEO equivalent testing all tested front and back surfaces of ion-beam treated FCCs remained fully charge dissipative. The surface resistivity additionally decreased on all tested ion-beam treated FCCs during the time of GEO equivalent testing, coming to SR values in a narrow range of (3-7) MΩ/sq after 15 years of GEO space equivalent testing. It means, that the phenomenon of so-called radiation-induced surface conductivity [13] was observed on all ion-beam treated FCC samples during testing.

Figures 14A, 15:
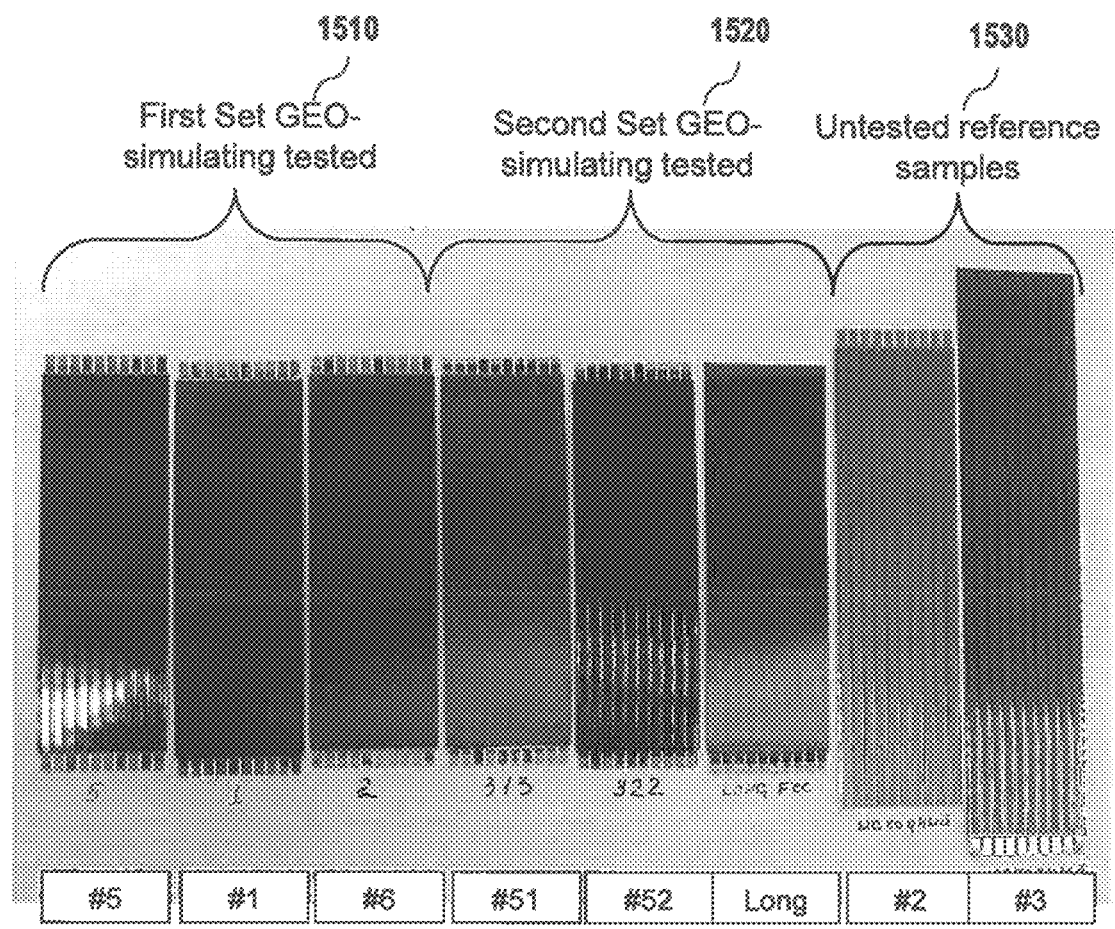
FIG. 14a An eighth table illustrating surface resistivity values of ion-beam treated FCCs before and after simulated 4 and 15 years of GEO exposure.
FIG. 15 All FCC samples, for which thermal optical characteristics have been measured.

Thermo-Optical Properties in GEO Simulated Conditions:

Since during the practical service of the FCCs in solar arrays, they will be exposed to GEO space environment, i.e. represent a part of external functional structures, another very important part of this study was the full characterization of Thermal Optical characteristics of the front and back sides of pristine and ion-beam treated FCCs samples, as well as for those exposed to GEO imitating conditions. FIG. 15 presents all samples used in this evaluation for thermal optical characteristic measurements.

In FIG. 15 from left to right, samples of the first and second tested sets (1510 and 1520) as well as the untested reference set (1530) are presented and are marked separately (#5, #1, #6—first tested set, #51, #52, Long—second tested set, #2, #3—pristine and ion-beam treated (but not tested) FCCs, from left to right). All GEO simulation tested front and back surfaces are almost blackish (fronts) or dark-greyish (backs), and are easily distinguishable—the front being glossy, and the back—matt. For the two last non-tested samples at the right hand side #2 is a pristine, and #3 is an ion-beam treated, both non-tested FCC samples. For them thermal optical properties have been measured to have a baseline for comparison.

Solar reflectance spectra have been measured for all FCCs shown in FIG. 15 and solar absorptance values a have been calculated, based on these measurements, following the ASTM standard E903 [14]. Thermal emittance c was measured following the ASTM standard E408 [15].

Figure 16:
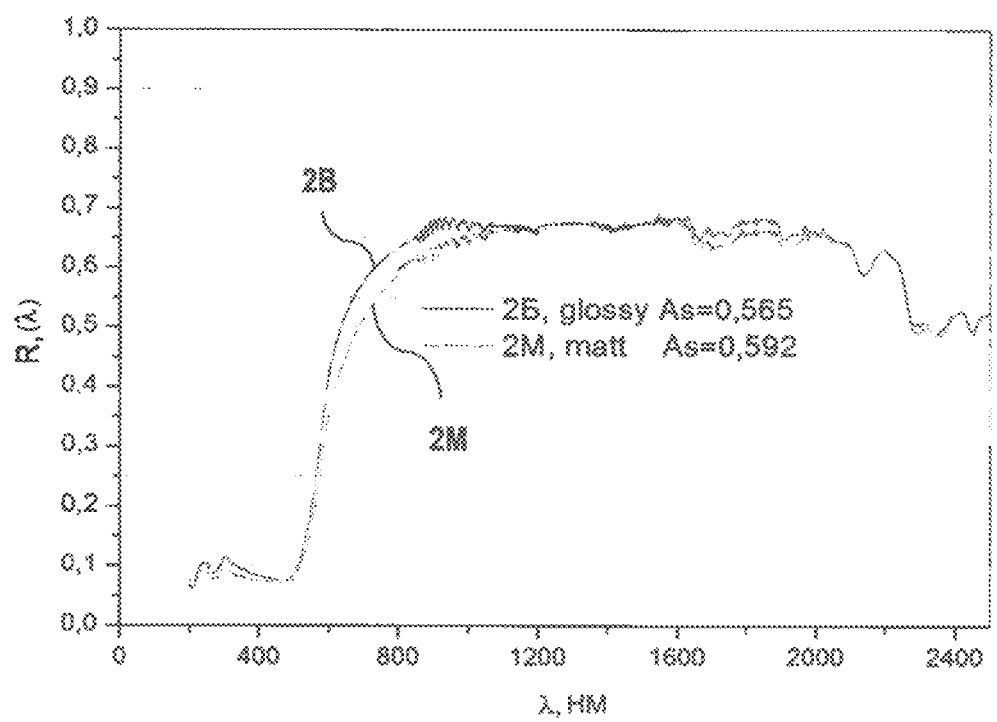
FIG. 16 Solar reflectance spectra and solar absorptance values for glossy front (2B) and matt back (2M) sides of the pristine FCC sample of FIG. 2.
Figure 17:
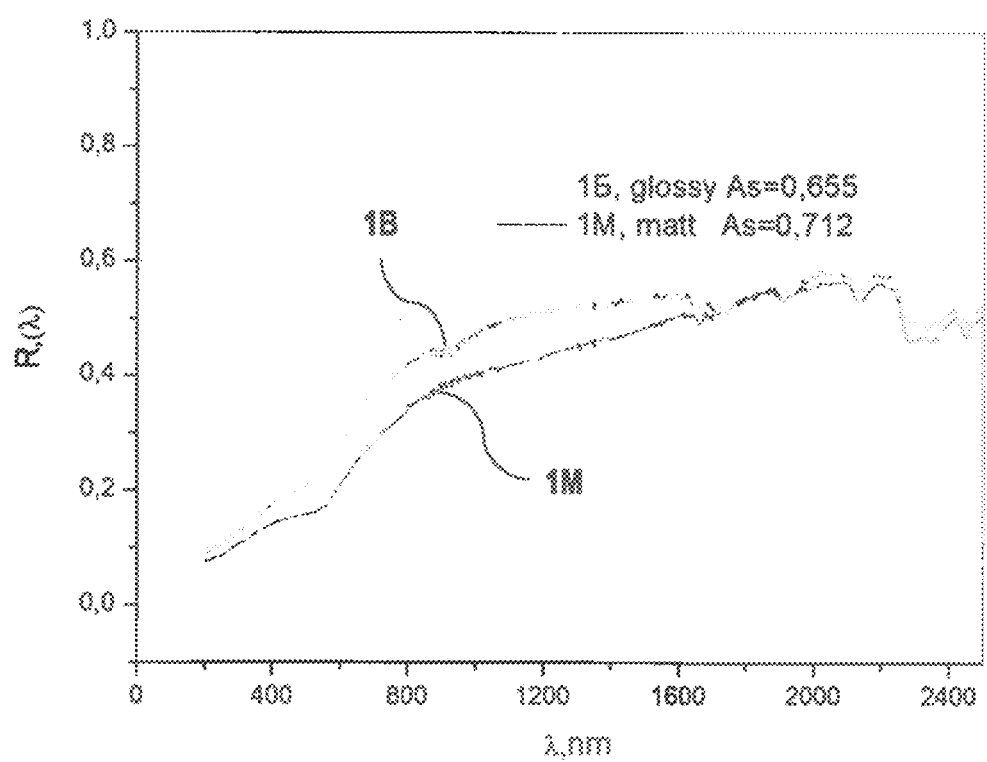
FIG. 17 Solar reflectance spectra and solar absorptance values for glossy front (1B) and matt back (1M) surfaces of an ion beam treated FCC (sample #1).

The results for a pristine FCC sample #2, labelled 2B for front glossy side and 2M for back matt side are presented in FIG. 16, and the spectra and the solar absorptance α values for both glossy front (1B) and matt back (1M) surfaces of an ion-beam treated sample #1 are presented in FIG. 17.

It is clearly seen that the ion-beam treatment reduced the reflectance in both visible and near infrared spectral regions (compare FIG. 16 and FIG. 17). Thermal emittance measurement results had shown insignificant change of ε on both surfaces due to ion-beam treatment, and all these thermal optical results are presented in the table in FIG. 17a.

The change in solar absorptance due to the performed ion-beam treatment for front FCC surface is around $\Delta\alpha_s=0.09$, and for the back surface it is around $\Delta\alpha_s=0.12$. Thermal emittance measurements did not show any measurable change after ion-beam treatment.

To provide the forecast of their potential end-of-life (EOL) properties after 15 years in GEO space environment, the solar reflectance spectra and solar absorptance values of two pristine (samples #5 and #6) and one ion-beam treated (sample #1) FCCs after full GEO-imitated testing have been measured. The solar absorptance on the exposed pristine and treated surfaces increased in both visible and infrared areas, coming to $\alpha_{front}\approx0.79$ for the front of a pristine sample (sample #5) and to $\alpha_{back}\approx0.82$ for the back of a pristine sample (sample #6) and $\alpha_{back}\approx0.82$ for the back surface of an ion-ream treated FCC (sample #1) due to long-term GEO-simulated exposure. Thermal emittance measurements showed insignificant changes, with thermal emittance remaining around $\varepsilon=0.80\pm0.02$.

In addition, the pre-test solar reflectance spectra and solar absorptance values for 4 ion-beam treated FCCs before and after GEO imitating testing have been measured. A strong decrease of solar reflectance does happen in the visible part of the spectra for all tested FCCs, in qualitative agreement with the darkening effects observed due to testing. These thermal optical characteristics have been collected and are presented in the tables in FIGS. 17b and 17c. A conclusion can be made, that the developed ion-beam treatment does increase the solar absorptance of the treated FCCs surfaces; however, it practically almost does not have an influence on the final thermal optical characteristics of the FCCs after 15 years in GEO space environment. The darkening effects in pristine and ion-beam treated surfaces and change of both thermal optical characteristics are almost equally strongly pronounced on both sides of pristine and ion-beam treated FCCs!

Charge Dissipative Properties Verified by ESD Testing:

The fact that the surface is sufficiently charge dissipating was confirmed in a dedicated ESD test at a worst case temperature of −145° C. which simulated the relevant charging environment for external surfaces in geostationary orbit. In the ESD test a second set of samples was tested which was exposed before simultaneously to particle and UV radiation representative for geostationary environment (samples #51 and #52 of FIG. 15).

The ESD Test was Conducted with the Following Conditions:

20 and 400 keV electron beams diffused in energy and angle for space like energy distribution and flux homogeneity on a sample diameter of 20 CM.

Fluxes: 20 keV 250 pA*cm$^{-2}$ ($\approx1.56*10^9$ s$^{-1}$*cm$^{-2}$), 0-400 keV 50 pA*cm$^{-2}$ ($\approx3.12*10^8$ s$^{-1}$*cm$^{-2}$); and 4× fluxes of 20 keV and 0-400 keV (worst case environment from customer requirements for external surfaces on telecommunication satellites)

Test temperatures: RT, −145° C.

Vacuum 10$^{-6}$ hPa

Two sets of FCCs were tested: i) beginning of life meaning as treated and ii) GEO tested. Both sets of samples were exposed to the charging environment with one smooth and one rough FCC side. The potential was measured as well as its decay. Detection of arcing was ensured by the facility setup.

Figure 18:
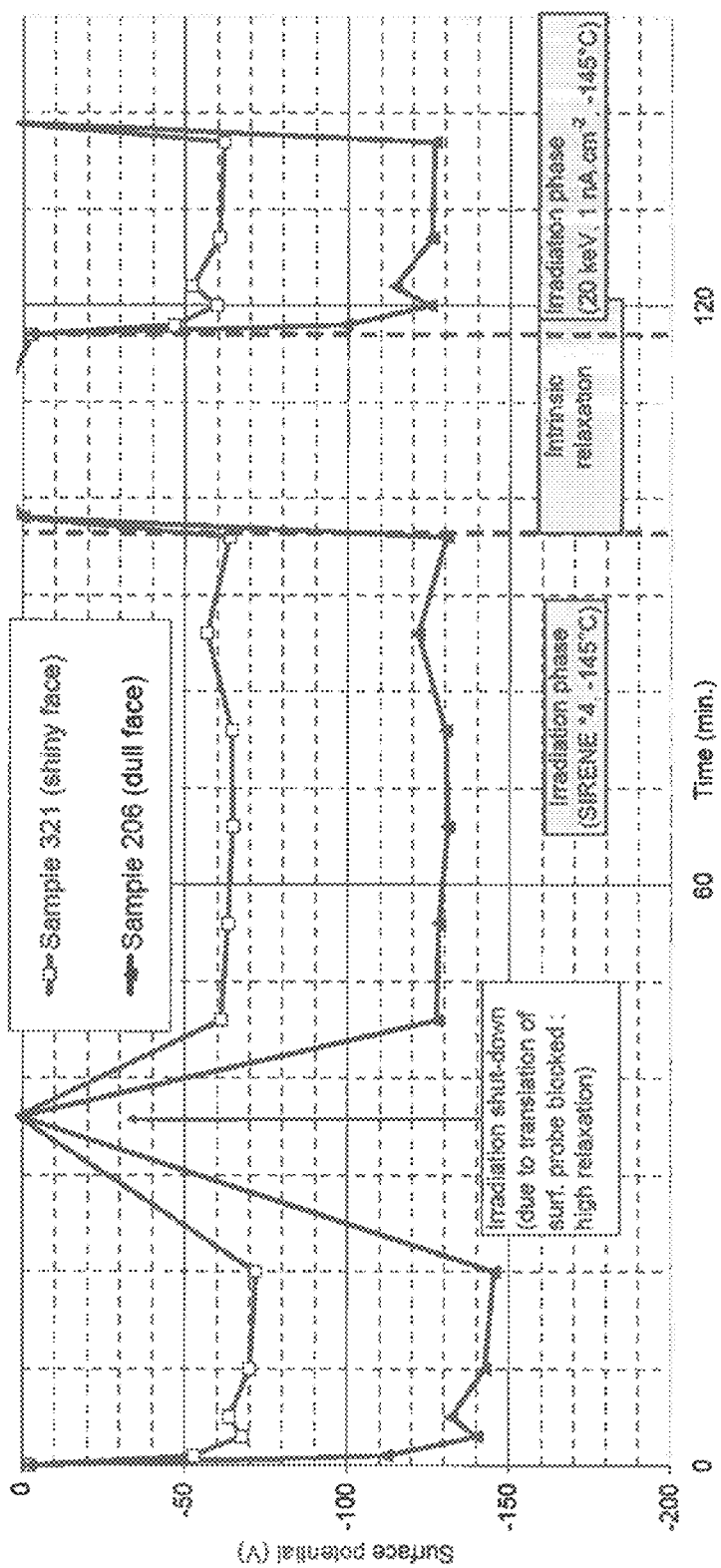
FIG. 18 Measured surface potential during a charging test at −145° C.

The worst case (−145° C., 4× standard geostationary) charging environment was tested on as treated FCCs and GEO aged FCCs. No arcing was observed. The highest potential which was observed for the as treated samples with the rough side exposed was below 150V and thus far below any critical potential, e.g. 1000 V. The relaxation of the potential was very fast after the electron source was switched off. This is due to quick charge depletion via the grounding connection. In addition mono-energetic charging at low electron energies and −145° C. was performed and showed again the same behavior. In this case the test demonstrated that even if the charging was limited to the upper layers the potential relaxation was again fast and efficient via the grounded surface (FIG. 18).

The same conditions were applied to the GEO aged FCCs. In contrast to the as treated FCCs they almost did not build up any potential. This can be explained by the even lower surface resistivity which is obtained after exposure to electron and proton radiation (see the tables in FIGS. 14a and 17d).

In contrast, untreated FCC (CE), exposed to the same ESD test, showed surface charging above any critical voltage and subsequent electrostatic discharge.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

100 Flat Cable Conductor (FCC)
101 front surface
102 grooved surface of FCC 100 of the front surface 101
201 back surface
202 grooved surface of FCC 100 of the back surface 201
300 magnified SEM image of front surface of state-of-art FCC 100
400 magnified SEM image of back surface of state-of-art FCC 100
1301 FCC
1302 FCC
1303 FCC
1401 FCC
1402 FCC
1403 FCC
1404 FCC
1510 first set of GEO simulated FCCs
1520 second set of GEO simulated FCCs
1530 untested reference samples

REFERENCES

1. D. Fink, Fundamentals of ion-irradiated polymers, Elsevier, 2004
2. A. V. Kondyurin, M. Bilek, Ion beam treatment of polymers: application aspects from medicine to space, Elsevier, 2010
3. H. Dong, T. Bell, State-of-the-art overview: ion beam surface modification of polymers towards improving tribological properties, Surface and Coatings Technology, Volume 111, Issue 1, 10 Jan. 1999, Pages 29-40
4. V. Zaporojtchenko, J. Zekonyte, J. Erichsen, F. Faupel "Etching Rate and Structural Modification of Polymer Films During Low Energy Ion Irradiation", Nuclear Instruments and Methods in Physics Research B (NIMB) 208, 155 (2003)
5. Z. Iskanderova, J. Kleiman, V. Issoupov, F. Bussieres, "Carbosurf TM Surface Modification Technology for Charge Dissipative and Radio-Transparent GEO Durable Space Polymers", Proceedings of the 9-th International Conference "Protection of Materials and Structures from Space Environment (ICPMSE-9)", Ed. J. Kleiman, AIP Conference Proceedings, 2009, p. 588-599.
6. J. I. Kleiman, Z. Iskanderova, F. Bussieres, A. Grigorevskiy, R. Sodhi, Ion-beam Treatment for Enhancement of Durability and Surface Conductivity of Space Polymers: Results, Analysis, Mechanisms, Protection of Materials and Structures from the Space Environment, Eds. J. Kleiman, M. Tagawa, and Y. Kimoto, Springer, 2013, pp. 317-326.
7 DuPont Technical Information, PyraluxR LF Coverlay Flexible Composites
8. (http://www.livestrong.com/article/174049-what-is-pumice-composed-of/)
9. M. Baillie, J. Ming-Chung, "Method of Measuring Surface Resistivity Using Square Electrodes and Multiplying Surface Resistance Measurements by a Correction Factor", U.S. Pat. No. 5,391,994, Feb. 21, 1995
10. J. F. Ziegler, TRIM-90, "Transport of Ions in Matter", International Business Machine Corp., 1990
11. V. Zaporojtchenko, J. Zekonyte, J. Erichsen, F. Faupel, "Etching Rate and Structural Modification of Polymer Films During Low Energy Ion Irradiation", Nuclear Instruments and Methods in Physics Research B (NIMB), 208, 155 (2003)
12. International Standard ISO 15856:2010(E): Space systems—space environment—simulation guidelines for radiation exposure of non-metallic materials
13. Smirnov I. A., Radiation-induced conductivity of polymers at long-time radiation exposure, PhD Theses, Russia, 2006)
14. ASTM E903—Standard Test Method for Solar Absorptance, Reflectance, and Transmittance of Materials Using Integrating Spheres
15. ASTM E408-13 Standard Test Methods for Total Normal Emittance of Surfaces Using Inspection-Meter Techniques
16. Mott, N. F., Localized states in a pseudo-gap and near extremities of conduction and valence bands, Phil. Mag. 19: 835, (1969)
17. V. K. S. Shante, Variable-range hopping conduction in thin films, Physics Letters A, Volume 43, Issue 3, 12 Mar. 1973, pp. 249-250
18. Shounak De, S. Niranajana, Mott conductivity in nanocluster carbon thin films, Optoelectronics and Advanced Materials—Rapid Communications, v. 3, 312, December 2009, pp. 1365-1367.

The invention claimed is:

1. A method for manufacturing a charge dissipative surface layer on a member, the member comprising:
a dielectric polymer-based material or composite which is configured for use in space or other extreme environments; and
two opposing surfaces, each of the two opposing surfaces having a flat or a three-dimensional shape, wherein at least one of the two opposing surfaces has a rough surface having embedded inorganic particles or fiber fillers, the method comprising:

carbonizing at least the rough surface of the member in a vacuum environment through ion bombardment with simultaneous surface renewal, by bombardment of the rough surface with an ion beam formed in a gaseous linear ion beam source of noble gas and constantly added predetermined amount of a carbonaceous gas in an ion beam gas admixture to achieve a treated carbonized surface layer with a uniform surface resistivity in a charge dissipative range, wherein the ion beam has an energy of 2.5 to 3 keV.

2. The method according to claim 1, wherein the charge dissipative surface layer comprises a charge dissipative range of dozens MOhms/sq at room temperature.

3. The method according to claim 1, wherein the carbonaceous gas acetylene is used.

4. The method according to claim 1, wherein out-gassing of a polymer-based material of the member is produced in a vacuum environment, with follow-up heating up to a temperature in a range between 50° C. and 75° C., during the bombardment of the at least one of the two opposing surfaces so as to reduce the treatment time and enhance carbonization quality.

5. The method according to claim 1, wherein the method is applied to the member made of copper strips laminated between Polyimide-based self-adhesive foils which is intended to be used in electric and electronic applications to produce charge dissipative surfaces while preserving mechanical and electrical bulk properties of these standard products.

* * * * *